United States Patent
Nagata et al.

(10) Patent No.: US 7,249,336 B2
(45) Date of Patent: Jul. 24, 2007

(54) AUTOMATIC WIRING METHOD FOR SEMICONDUCTOR INTEGRATED CIRCUIT, PROGRAM FOR THE SAME, AND SEMICONDUCTOR INTEGRATED CIRCUIT

(75) Inventors: Shunya Nagata, Kanagawa (JP); Akiko Tooyama, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 323 days.

(21) Appl. No.: 10/864,642

(22) Filed: Jun. 10, 2004

(65) Prior Publication Data
US 2004/0251535 A1 Dec. 16, 2004

(30) Foreign Application Priority Data
Jun. 13, 2003 (JP) .............................. 2003-168871

(51) Int. Cl.
*G06F 17/50* (2006.01)
(52) U.S. Cl. .............................. 716/13; 716/12; 716/14
(58) Field of Classification Search .................. 716/13, 716/12, 14
See application file for complete search history.

(56) References Cited

U.S. PATENT DOCUMENTS

| | | | | |
|---|---|---|---|---|
| 4,811,237 A | * | 3/1989 | Putatunda et al. ............. | 716/9 |
| 5,490,103 A | * | 2/1996 | Haraguchi et al. ............ | 365/63 |
| 5,581,202 A | * | 12/1996 | Yano et al. ................. | 326/101 |
| 5,824,570 A | * | 10/1998 | Aoki et al. ................. | 438/128 |
| 5,972,740 A | * | 10/1999 | Nakamori ................... | 438/129 |
| 6,025,616 A | * | 2/2000 | Nguyen et al. ............. | 257/207 |
| 6,305,000 B1 | * | 10/2001 | Phan et al. ..................... | 716/5 |
| 6,306,745 B1 | * | 10/2001 | Chen ........................... | 438/599 |
| 6,480,989 B2 | * | 11/2002 | Chan et al. .................... | 716/8 |
| 6,504,187 B1 | | 1/2003 | Furuichi | |
| 6,539,530 B1 | * | 3/2003 | Torii ........................... | 716/12 |
| 6,657,307 B2 | | 12/2003 | Iwamoto | |
| 6,763,511 B2 | | 7/2004 | Banno et al. | |
| 6,774,412 B2 | | 8/2004 | Komaki | |

FOREIGN PATENT DOCUMENTS

| | | |
|---|---|---|
| JP | 2001-168291 A | 6/2001 |
| JP | 2001-338982 | 7/2001 |
| JP | 2002-299450 | 10/2002 |
| JP | 2003-115542 | 4/2003 |

* cited by examiner

*Primary Examiner*—Sun James Lin
(74) *Attorney, Agent, or Firm*—Foley & Lardner LLP

(57) ABSTRACT

A controller arranges macrocells having power terminals and ground terminals in desired positions on a semiconductor chip. The power terminals and ground terminals are arranged in a fourth line layer such that the centers of square power terminals and ground terminals substantially coincide with lattice points, and terminals of different types are not mixed along the same row, for example. The controller then forms an orbital power ring, performs terminal processing of the chip internal power line, retrieves from the terminal information library the defined position of a single terminal in each row from among the power terminals and ground terminals, and identifies the position as that of a terminal to be connected. The controller then forms longitudinal power line for each of the power terminals and ground terminals that has the same line width as one side of the terminals so as to overlap with each of the power terminals and ground terminals forming the same row, and connects the orbital power ring with each of the power terminals and ground terminals.

36 Claims, 15 Drawing Sheets

US 7,249,336 B2

AUTOMATIC WIRING METHOD FOR SEMICONDUCTOR INTEGRATED CIRCUIT, PROGRAM FOR THE SAME, AND SEMICONDUCTOR INTEGRATED CIRCUIT

BACKGROUND OF THE INVENTION

1. Field of the Invention

The present invention relates to an automatic wiring method for a semiconductor integrated circuit, a program for the same, and a semiconductor integrated circuit, and, more particularly, to an automatic wiring method for a semiconductor integrated circuit suitable for use in designing a cell-based IC, which is one type of ASIC (Application Specific Integrated Circuit), having macrocells registered in a library and laid out on an IC chip, to a program for the same, and to a semiconductor integrated circuit designed by means of this type of automatic wiring method for a semiconductor integrated circuit.

2. Description of a Related Art

Recent development of higher-level integration and higher density system design in semiconductor integrated circuits, such as large-scale integrated circuits (LSI), very large-scale integrated circuits (VLSI), and ultra large-scale integrated circuits (ULSI), has allowed an integrated circuit having over one million transistors. One example is a system LSI, in which a system composed of a central processing device (CPU), a storage device (ROM, RAM), a buffer, and a plurality of peripheral devices and the like for processing various signals are connected by a bus, signal line, or the like, and the system is built into a single semiconductor chip.

Because of the large circuit size of this type of system LSI, transistor-level circuit design cannot be performed directly, and system design, functional design, detailed logical design, and circuit design must be performed in sequential stepwise fashion.

In the system design, the operation and structure of the system as a whole are determined so as to render the CPU, ROM, RAM, buffer, and plurality of peripheral devices each as a single functional block to obtain the desired function. In the functional design, the relationship between functional blocks and the internal operation of the functional blocks are determined based on the specifications determined in the system design. In the detailed logical design, a simulation model of the semiconductor integrated circuit is created by laying out macrocells for constituting the functional blocks whose operation was determined by the above-mentioned functional design on an IC chip, and interconnecting (arranging and wiring) these components.

The above-mentioned macrocells are composed of NAND gates, NOR gates, or other basic logical elements, as well as latches, counters, memory, or other basic logical circuits made up of a combination of the aforementioned gates. The above-mentioned macrocells are registered as a library in which their functions are described using Hardware Description Language (HDL), C-language (registered trademark), or another programming language.

The semiconductor integrated circuit simulation model thus created is compiled along with the macrocell library, a simulation of the operation thereof is carried out, and verification is performed for verifying whether or not the desired function will be obtained.

In the circuit design, the transistor-level electronic circuit and element characteristics are determined so as to satisfy the circuit specification based on the logical design consisting of the functional design and detailed logical design.

Computer simulation of the circuit operation and verification are also performed in design stages other than the logical design.

FIG. 18 is an overhead schematic view of a macrocell constituting a cell-based IC designed by the conventional semiconductor integrated circuit design method (logical design) and the periphery thereof, and FIGS. 19 and 20 are process diagrams for describing the same design method.

As depicted in FIGS. 18 and 19, the macrocell in this example has rectangular power terminals 2a and 2b, ground terminals 3a and 3b, a plurality of input/output terminals 4, 4, and so on formed on the edge of the core 1. The rectangular power terminals 2a and 2b and ground terminals 3a and 3b are formed in the third layer inside the core unit 1, and connected to the longitudinal power line and longitudinal ground line arranged in the fourth layer.

The substantially rectangular frame formed by the boundary of the rim of the core 1 or the extension thereof and the straight line obtained by connecting the leading ends of the plurality of input/output terminals 4, 4, and so on formed at the lower edge of the core 1 is referred to as a macro outer frame 5, and the orbital power ring 6 is formed so as to enclose the macro outer frame 5 in the vicinity of the macro outer frame 5.

This semiconductor integrated circuit design method is executed by means of a design support program stored in the storage unit of a design support device being processed by a controller having a CPU.

First, the above-mentioned controller positions the macrocell in the desired location on the chip on the basis of chip data and macrocell data read from the storage unit.

The rectangular power terminals 2a and 2b and ground terminals 3a and 3b constituting the line pattern are then placed on the third layer inside the core 1 as depicted in FIG. 19.

The above-mentioned controller reads the information stored in the storage unit for the chip internal power line composed of the transverse ground bus 7 and transverse power bus 8 in a pair lined in the fifth layer, and when the transverse ground bus 7 and transverse power bus 8 are present near the macro outer frame 5 in the placement setting area of a given width from the top of the macro outer frame 5 upward and from the bottom thereof downward, these components are set as the transverse power line and transverse ground line constituting a quasi-orbital power ring 6, as depicted in the same figure.

When placement of additional transverse power line or transverse ground line is possible in the above-mentioned placement setting area above and below the transverse ground bus 7 and transverse power bus 8 constituting the orbital power ring 6, the above-mentioned controller also adds and places independent transverse ground line 9 (12) or transverse power line 11 (13) as depicted in the same figure.

The above-mentioned controller then lines longitudinal power line 14 (16) and longitudinal ground line 15 (17) in a pair in the fourth layer inside the placement setting area of a given width that contains the left and right sides of the macro outer frame 5 as depicted in the same figure.

The above-mentioned controller then connects the longitudinal ground line 15 and 17, the transverse ground line 9 and 12, and the transverse ground bus 7 by a via-hole, and connects the longitudinal power line 14 and 16, the transverse power line 11 and 13, and the transverse power bus 8 by a via-hole.

The above-mentioned controller then performs terminal processing of the chip internal power line. Specifically, the above-mentioned controller connects and terminates the terminal longitudinal ground bus 18a with the transverse ground line 9 through the via-hole. The terminal longitudinal ground bus 18b and transverse ground line 12 are also connected and terminated through the via-hole. The above-mentioned controller also connects and terminates the terminal longitudinal power bus 18c with the transverse power line 11 through the via-hole, and connects and terminates the terminal longitudinal power bus 18d and transverse power line 13 through the via-hole.

The above-mentioned controller also connects and terminates the ground follow pin 18e with the longitudinal ground line 15 through the via-hole, and connects and terminates the ground follow pin 18f with the longitudinal ground line 17 through the via-hole. The above-mentioned controller also connects and terminates the power follow pin 18g with the longitudinal power line 14 through the via-hole, and connects and terminates the power follow pin 18h with the longitudinal power line 16 through the via-hole.

The above-mentioned controller then connects the orbital power ring 6 with the power terminals 2a and 2b and ground terminals 3a and 3b placed in the third layer of the macrocell. Specifically, the above-mentioned controller then places the longitudinal power line 19a and longitudinal ground line 19b in straight lines in the fourth layer over a section that starts at the upper transverse power line 11 and transverse ground line 9 that constitute the orbital power ring 6, passes directly over the power terminals 2a and 2b and ground terminals 3a and 3b, and extends all the way to the lower transverse power line 13 and transverse ground line 12 in the extending direction, as depicted in FIG. 20.

In this arrangement, via-holes are formed at the locations at which the longitudinal power line 19a and longitudinal ground line 19b overlap with the power terminals 2a and 2b and ground terminals 3a and 3b, and respective connections are made through the via-holes between the longitudinal power line 19a and the power terminals 2a and 2b, and between the longitudinal ground line 19b and the ground terminals 3a and 3b.

With the above-mentioned controller, the transverse ground bus 20a and transverse power bus 20b, which are formed in the fifth layer and made to pass over the core 1, are then connected with the longitudinal power line 14, 16, and 19a and with the longitudinal ground line 15, 17, and 19b, respectively, through the via-holes at the intersection points thereof as depicted in FIG. 18; a mesh-shaped power line structure is formed for maintaining the given power supply capability; and the sequence of processing is completed.

By means of this configuration, the structure of the macrocell and the power line connection method can be determined independent of the board information possessed by the semiconductor chip, particularly, the power line information. Even when other macrocells are formed above and below or to the left or right of the macrocell, a stable power supply can be provided without current dissipation or local voltage drop.

A technique is also proposed for providing a stable power supply independent of the layout or the like of the power line, whereby the power line of the macrocell is connected with the power line of the semiconductor chip via a power terminal (see Japanese Unexamined Patent Application Publication No. 2001-338982, for example). In this technique too, for example, a configuration is adopted whereby the power line and power terminal of the macrocell are connected via a through-hole.

However, the above-mentioned technique has drawbacks in that a large number of through-holes must be formed in order to connect the power terminals and ground terminals with the longitudinal power line and longitudinal ground line placed on a separate line layer, a long time is taken to generate position information and other information about as many through-holes as there are connection points, and the amount of calculation increases, thereby increasing the overall time required for the wiring process.

Drawbacks also exist whereby the size of the data to be stored increases because of the need to define and store in the storage unit location information about all of the power terminals and ground terminals in order to connect each of the power terminals and ground terminals with the longitudinal power line and longitudinal ground line.

Consequently, drawbacks also occur whereby the time taken to read the data in the wiring process increases, and the number of steps increases. Too much processing time is required particularly in such cases as when a large number of power terminals are in scattered positions.

Drawbacks occur when an orbital power ring is formed outside the macrocell, whereby the space occupied by the orbital power ring becomes large and the density of macrocells mounted on the semiconductor chip is reduced, thus creating an obstacle to the miniaturization of the surface area of the semiconductor chip.

Drawbacks also occur whereby the circuit pattern formed in the core 1 is formed only in the third or lower line layer, for example, in which the power terminals and ground terminals are formed, and the area in which no longitudinal power line or longitudinal ground line is placed in the fourth layer, in which the longitudinal power line and longitudinal ground line connected with the power terminals and ground terminals through the via-holes are placed, becomes unusable, wasted space. Because of this, drawbacks occur whereby the surface area of the macrocell increases, and the latitude of design flexibility is reduced.

SUMMARY OF THE INVENTION

A first object of the present invention developed in view of the foregoing drawbacks is to provide an automatic wiring method for a semiconductor integrated circuit, a program for the same, and a semiconductor integrated circuit, whereby the quantity of data needed for the wiring process can be reduced, the wiring process time can be shortened, and a semiconductor integrated circuit can be easily designed in a short period of time.

A second object of the present invention is to provide an automatic wiring method for a semiconductor integrated circuit, a program for the same, and a semiconductor integrated circuit, whereby miniaturization of the surface area of the macrocell and semiconductor chip can be achieved, and the latitude of design flexibility can be enhanced.

To these ends, according to one aspect of the present invention, there is provided an automatic wiring method for a semiconductor integrated circuit used to form a semiconductor integrated circuit for performing a desired operation by laying out and interconnecting a plurality of macrocells, each implementing a given function, on a semiconductor chip, the method comprising (a) a step of arranging a macrocell, in which a plurality of power terminals and a plurality of ground terminals are formed, on the semiconductor chip; (b) a step of forming a loop line group containing a first power line and a first ground line for supplying power to the macrocell along an outer frame of the macrocell; and (c) a step of connecting a corresponding one of the power terminals with the first power line that constitutes the loop line group via a second power line, and connecting a corresponding one of the ground terminals with the first ground line that constitutes the loop line group via a second ground line; wherein the power terminals and the ground terminals are arranged in optimum positions inside the macrocell arranged on the semiconductor chip in the step (a), using the same line layer as the corresponding second power line and second ground line.

In the above automatic wiring method, the power terminals and the ground terminals may be arranged in a plurality of rows along an extending direction of the second power line and the second ground line wired in the step (c), so as to at least partially overlap with the second power line and the second ground line, in the macrocell arranged on the semiconductor chip in the step (a), and only the same type of terminals in the power terminals or the ground terminals of each row may be arranged in a straight line along the extending direction.

In the above automatic wiring method, the second power line and the second ground line may be arranged in the step (c) based on information in which at least one of either the power terminals or the ground terminals in corresponding rows is defined.

According to another aspect of the present invention, there is provided an automatic wiring method for a semiconductor integrated circuit used to form a semiconductor integrated circuit for performing a desired operation by laying out and interconnecting a plurality of macrocells, each implementing a given function, on a semiconductor chip, the method comprising (a) a step of arranging a macrocell, in which a plurality of power terminals and a plurality of ground terminals are formed, on the semiconductor chip; (b) a step of forming a loop line group containing a first power line and a first ground line for supplying power to the macrocell along an outer frame of the macrocell; and (c) a step of connecting a corresponding one of the power terminals with the first power line that constitutes the loop line group via a second power line, and connecting a corresponding one of the ground terminals with the first ground line that constitutes the loop line group via a second ground line; wherein a given area, which is set away from the outer frame of the macrocell arranged on the semiconductor chip in the step (a) towards a center of the macrocell, is defined as a wiring limit area in which at least a part of the loop line group can be arranged.

In the above automatic wiring method, placement of an internal line layer of the macrocell in the same layer as the first power line and the first ground line that constitute the loop line group is preferably prohibited in the wiring limit area.

In the above automatic wiring method, a part of an internal line layer of the macrocell may be formed in the same layer as the power terminals and the ground terminals.

In the above automatic wiring method, the same information that contains positional information about the power terminals and the ground terminals may be applied in part of the steps (a), (b), and (c) for macrocell pairs in which arrangement patterns of the power terminals and the round terminals are in a symmetrical relation with each other.

In the above automatic wiring method, the loop line group may contain a chip internal power line located nearest to the outer frame of the macrocell, among chip internal power lines wired at a given interval. Further, the loop line group may be used as a bypass line to connect the chip internal power line with the power terminals and the ground terminals.

According to another aspect of the present invention, there is provided a computer program product, in a computer readable medium, for automatic wiring of a semiconductor integrated circuit used to form a semiconductor integrated circuit for performing a desired operation by laying out and interconnecting a plurality of macrocells, each implementing a given function, on a semiconductor chip, the computer program product comprising (a) instruction for arranging a macrocell, in which a plurality of power terminals and a plurality of ground terminals are formed, on the semiconductor chip; (b) instruction for forming a loop line group containing a first power line and a first ground line for supplying power to the macrocell along an outer frame of the macrocell; and (c) instruction for connecting a corresponding one of the power terminals with the first power line that constitutes the loop line group via a second power line, and connecting a corresponding one of the ground terminals with the first ground line that constitutes the loop line group via a second ground line; wherein the power terminals and the ground terminals are arranged in optimum positions inside the macrocell arranged on the semiconductor chip by the instruction (a), using the same line layer as the corresponding second power line and second ground line.

According to yet another aspect of the present invention, there is provided a computer program product, in a computer readable medium, for automatic wiring of a semiconductor integrated circuit used to form a semiconductor integrated circuit for performing a desired operation by laying out and interconnecting a plurality of macrocells, each implementing a given function, on a semiconductor chip, the computer program product comprising (a) instruction for arranging a macrocell, in which a plurality of power terminals and a plurality of ground terminals are formed, on the semiconductor chip; (b) instruction for forming a loop line group containing a first power line and a first ground line for supplying power to the macrocell along an outer frame of the macrocell; and (c) instruction for connecting a corresponding one of the power terminals with the first power line that constitutes the loop line group via a second power line, and connecting a corresponding one of the ground terminals with the first ground line that constitutes the loop line group via a second ground line; wherein a given area, which is set away from the outer frame of the macrocell arranged on the semiconductor chip by the instruction (a) towards a center of the macrocell, is defined as a wiring limit area in which at least a part of the loop line group can be arranged.

According to still another aspect of the present invention, there is provided a semiconductor integrated circuit for performing a desired operation in which a plurality of interconnected macrocells, each implementing a given function, are laid out on a semiconductor chip, wherein a plurality of power terminals and a plurality of ground terminals are formed in a macrocell; a loop line group containing a first power line for supplying power to the macrocell and a first ground line is formed along an outer frame of the macrocell; a corresponding one of the power terminals is connected with the first power line that constitutes the loop line group via a second power line, and a corresponding one of the ground terminals is connected with the first ground line that constitutes the loop line group via a second ground line; and the power terminals and the ground terminals are wired using the same line layer as the corresponding second power line and second ground line.

In the above semiconductor integrated circuit, the power terminals and the ground terminals may be arranged in a plurality of rows along an extending direction of the second power line and the second ground line, so as to at least partially overlap with the second power line and the second ground line, and only the same type of terminals in the power terminals or the ground terminals may be arranged in a straight line along the extending direction.

According to another aspect of the present invention, there is provided a semiconductor integrated circuit for performing a desired operation in which a plurality of interconnected macrocells, each implementing a given function, is laid out on a semiconductor chip, wherein a plurality of power terminals and a plurality of ground terminals are formed in a macrocell; a loop line group containing a first power line for supplying power to the macrocell and a first ground line is formed along an outer frame of the macrocell; a corresponding one of the power terminals is connected with the first power line that constitutes the loop line group via a second power line, and a corresponding one of the ground terminals is connected with the first ground line that constitutes the loop line group via a second ground line; and a given area, which is set away from the outer frame of the macrocell towards a center of the macrocell, is defined as a wiring limit area in which at least a part of the loop line group can be arranged.

In the above semiconductor integrated circuit, placement of an internal line layer of the macrocell in the same layer as the first power line and the first ground line that constitute the loop line group is preferably prohibited in the wiring limit area.

In the above semiconductor integrated circuit, the loop line group may contain a chip internal power line located nearest to the outer frame of the macrocell, among chip internal power lines wired at a given interval. Further, the loop line group may be used as a bypass line to connect the chip internal power line with the power terminals and the ground terminals.

According to another aspect of the present invention, there is provided an automatic wiring method for performing a wiring layout using a multilayer line in an electronic computer, comprising (a) a step of wiring a first constant potential line for transmitting a constant potential as a power source in an area outside of a macrocell; (b) a step of acquiring position information for a terminal disposed in the macrocell from a terminal library; and (c) a step of wiring a second constant potential line for connecting the first constant potential line and the terminal in the same line layer as the terminal based on the acquired position information.

In this automatic wiring method, the first constant potential line may be a ground line.

In the above automatic wiring method, position information for a row of terminals composed of a plurality of terminals lined up in one direction may be acquired from the terminal library in the step (b), and the row of terminals and the first constant potential line may be connected and the first constant potential line may be wired so as to overlap with the row of terminals in the step (c). Further, the position information for the row of terminals may be expressed as position information for one terminal contained in the row of terminals.

In the above automatic wiring method, a plurality of terminals arranged in a matrix to which the constant potential is supplied may be formed in the macrocell, and the terminal library may comprise position information for each of the terminals contained in one terminal line of the matrix, and position information for each of the terminals contained in one terminal row.

According to another aspect of the present invention, there is provided a semiconductor integrated circuit comprising a macrocell; a first constant potential line formed in an area outside the macrocell for transmitting a constant potential as a power source; a terminal disposed inside the macrocell and to which the constant potential is supplied; and a second constant potential line formed in the same line layer as the terminal, for connecting the first constant potential line with the terminal.

According to yet another aspect of the present invention, there is provided a computer program product, in a computer readable medium, for automatic wiring to perform a wiring layout using a multilayer line in an electronic computer, comprising instruction for wiring a first constant potential line for transmitting a constant potential as a power source in an area outside of a macrocell; instruction for acquiring position information for a terminal disposed in the macrocell from a terminal library; and instruction for wiring a second constant potential line for connecting the first constant potential line and the terminal in the same line layer as the terminal based on the acquired position information.

According to still another aspect of the present invention, there is provided an automatic wiring method for performing a wiring layout in an electronic computer, comprising a step of acquiring a macrocell from a library and arranging the macrocell; a step of wiring a loop line group for transmitting a power supply voltage in a vicinity and in a predefined area of the macrocell; a step of acquiring position information for a terminal disposed in the macrocell from a library; and a step of wiring a connection line for connecting the loop line group and the terminal based on the acquired position information.

According to another aspect of the present invention, there is provided a computer program product, in a computer readable medium, for automatic wiring to perform a wiring layout in an electronic computer, comprising instruction for acquiring a macrocell from a library and arranging the macrocell; instruction for wiring a loop line group for transmitting a power supply voltage in a vicinity and in a predefined area of the macrocell; instruction for acquiring position information for a terminal disposed in the macrocell from a library; and instruction for wiring a connection line for connecting the loop line group and the terminal based on the acquired position information.

According to another aspect of the present invention, there is provided a semiconductor integrated circuit comprising a macrocell in which a plurality of terminals is formed; a loop line group for transmitting power supply voltage in a vicinity and in a predefined area of the macrocell; and a connection line for connecting the loop line group and the plurality of terminals. In this semiconductor integrated circuit, the connection line and the plurality of terminals may be formed in the same line layer.

By means of the configuration of the present invention as described above, the power terminals and ground terminals are formed in the same layer as the second power line and second ground line, so the power terminals and ground terminals can be connected and formation of through-holes can be rendered unnecessary in the wiring process of the second power line and second ground line by simply stacking the second power line and second ground line, whereby the time required to generate the position information and the like of the through-holes can be saved and design can be carried out quickly.

Formation of through-holes can also be rendered unnecessary, so the possibility of design error occurring in the layout can also be reduced.

Storage capacity can be reduced because there is also no need to store the position information of the through-holes used in this wiring process.

By also arranging the power terminals and ground terminals along the line direction of the second power line and second ground line, respectively, so that at least a portion of the second power line and second ground line overlaps, with only terminals of the same type in rows, wiring can be performed if the position of at least one terminal in the rows is known among the power terminals and ground terminals.

Consequently, the amount of information defined in the terminal information library can be greatly reduced, and storage capacity can be reduced as well. Furthermore, design can be performed quickly because the search time and the like can also be shortened.

Placement of the loop line group internally in the macrocell is made possible by defining a given area from the outer frame of the macrocell towards the center of the macrocell as a wiring limit area in which at least a portion of the loop line group can be lined, so the size of the loop line group can be reduced and the interval between neighboring macrocells can be narrowed, whereby the density with which macrocells can be mounted on the semiconductor integrated circuit can be enhanced, and the semiconductor chip can be miniaturized.

Wiring inside the macrocell can also be performed using the line layer in the same layer as the power terminals and ground terminals in an area other than on the rows in which the power terminals and ground terminals are arrayed, so a portion of the macrocell internal line that was conventionally formed using a bottom line layer under the layer in which the power terminals and ground terminals are formed can be performed using the same line layer as the power terminals and ground terminals, whereby the wiring area per layer can be reduced, the surface area of the macrocell can be contracted, and the surface area of the semiconductor chip can be made smaller.

The latitude of design flexibility can also be enhanced by increasing the usable wiring area.

The arrangement pattern of the power terminals and ground terminals also has a mirror-image relationship when a semiconductor integrated circuit is designed that contains macrocells in which the power terminals and ground terminals of the same type are arranged in a checkered pattern so that their centers substantially coincide with the lattice points, and even when the macrocells are arranged in symmetry (for example, the macrocells are rotated 0°, 90°, 180°, or 270° or mirror-reflected about the X- or Y-axis) and arranged on the semiconductor chip, power line wiring to the macrocells can be executed by exactly the same method (second and third steps) and using exactly the same macrocell data (for example, layout data and terminal information data).

The latitude of flexibility in macrocell arrangement and layout on the semiconductor chip can thus be enhanced with comparatively low design expenditure. By the above-mentioned arrangement method, storage capacity can be reduced when arranging a plurality of macrocells with the same shape on a semiconductor chip.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Embodiments of the present invention will be described hereinafter with reference to the accompanying drawings. A detailed description will be given using the embodiments.

First Embodiment

Figure 1:
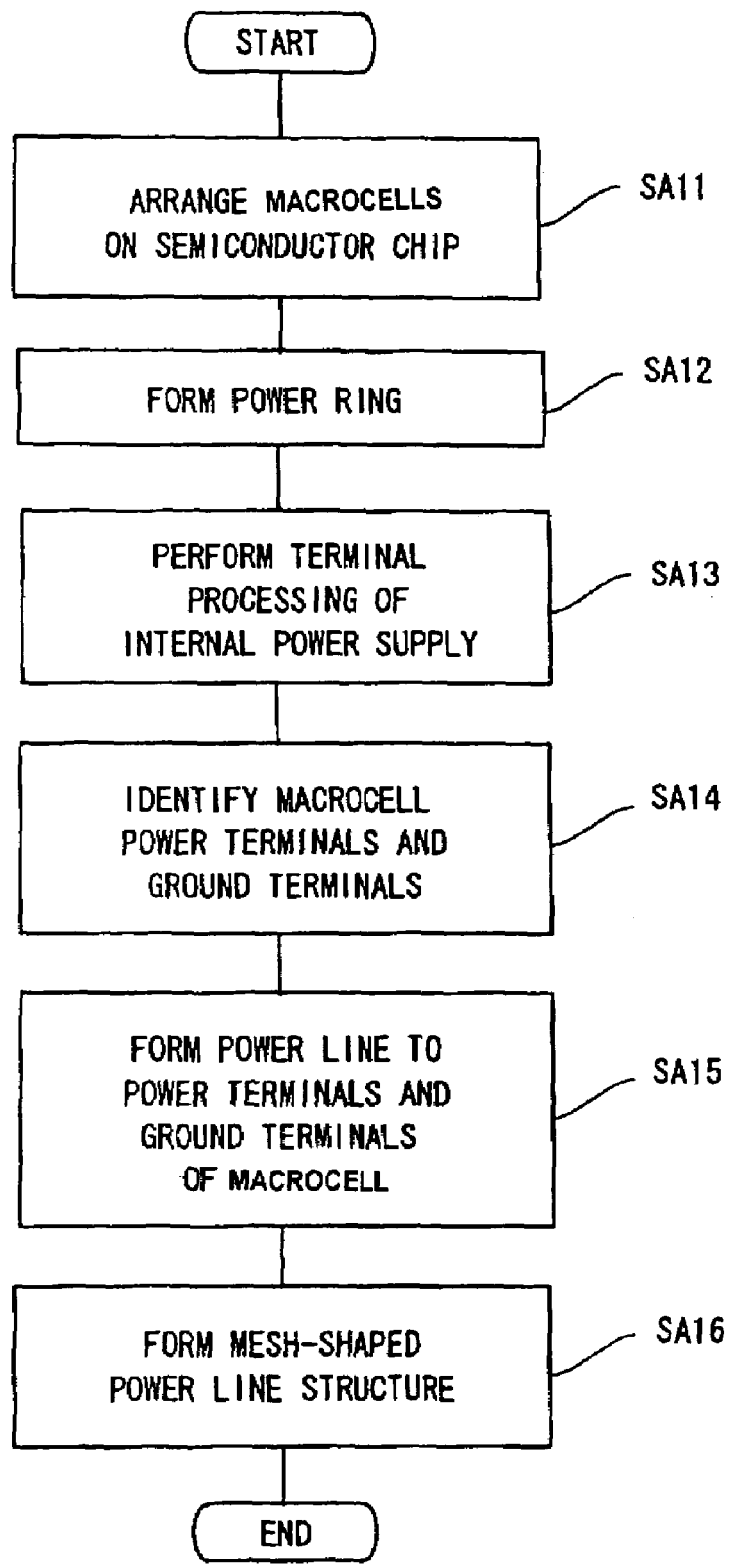
FIG. 1 is a flowchart depicting the semiconductor integrated circuit design method of the first embodiment of the present invention.
Figure 2:
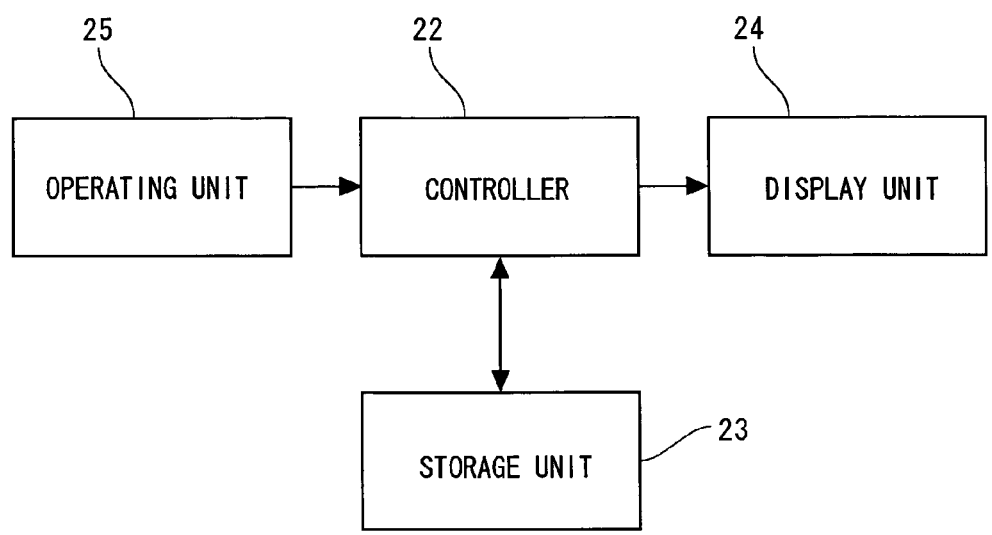
FIG. 2 is a block diagram depicting the structure of the design apparatus of the same semiconductor integrated circuit.
Figure 7:
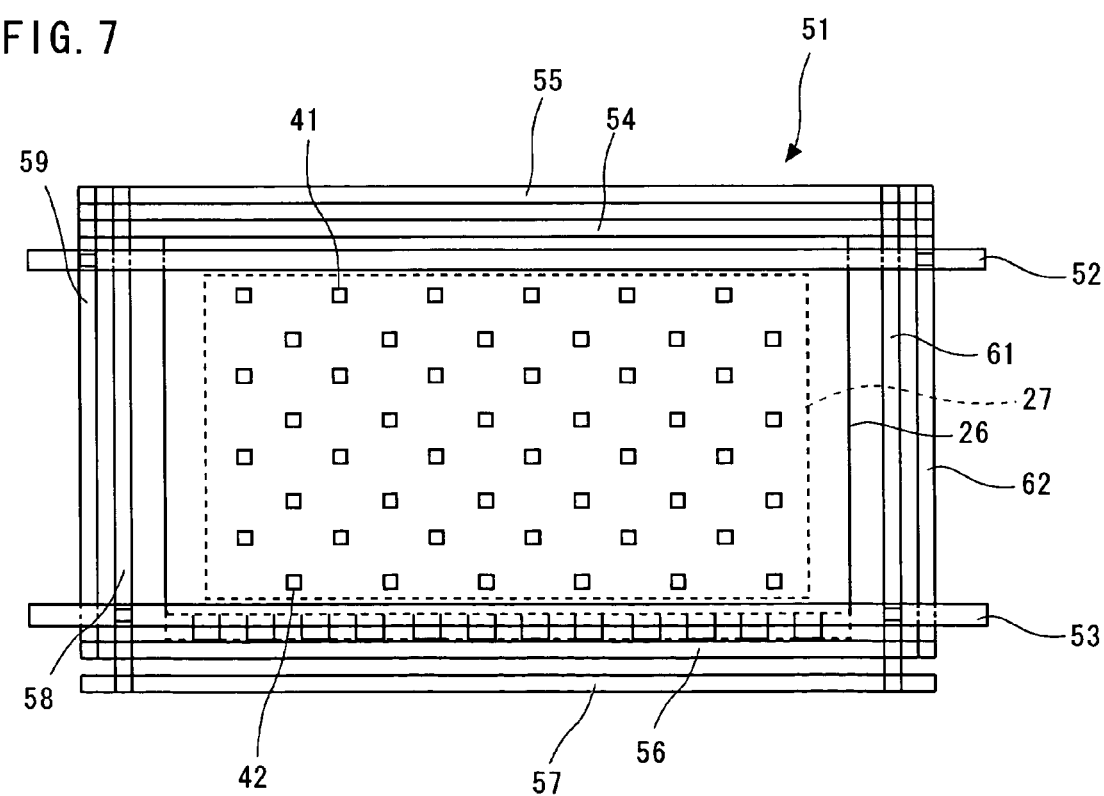
FIG. 7 is a process diagram depicting the same design method.
Figure 8:
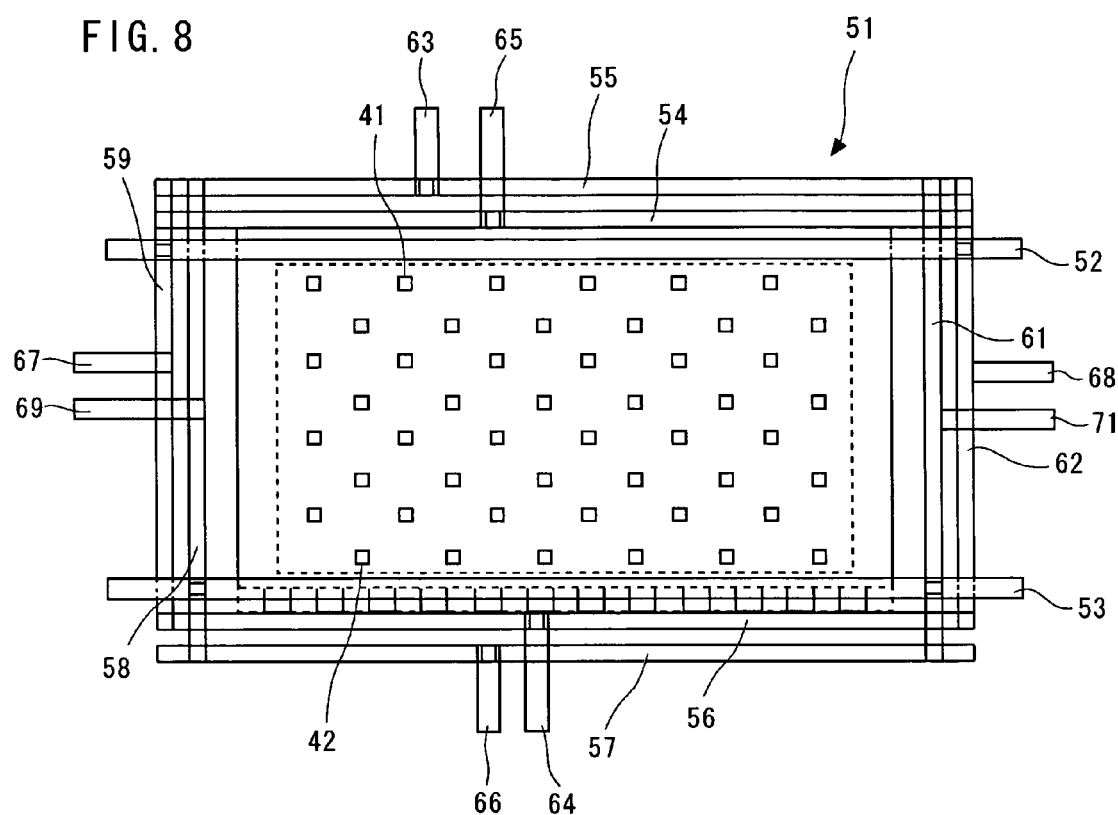
FIG. 8 is a process diagram depicting the same design method.
Figure 9:
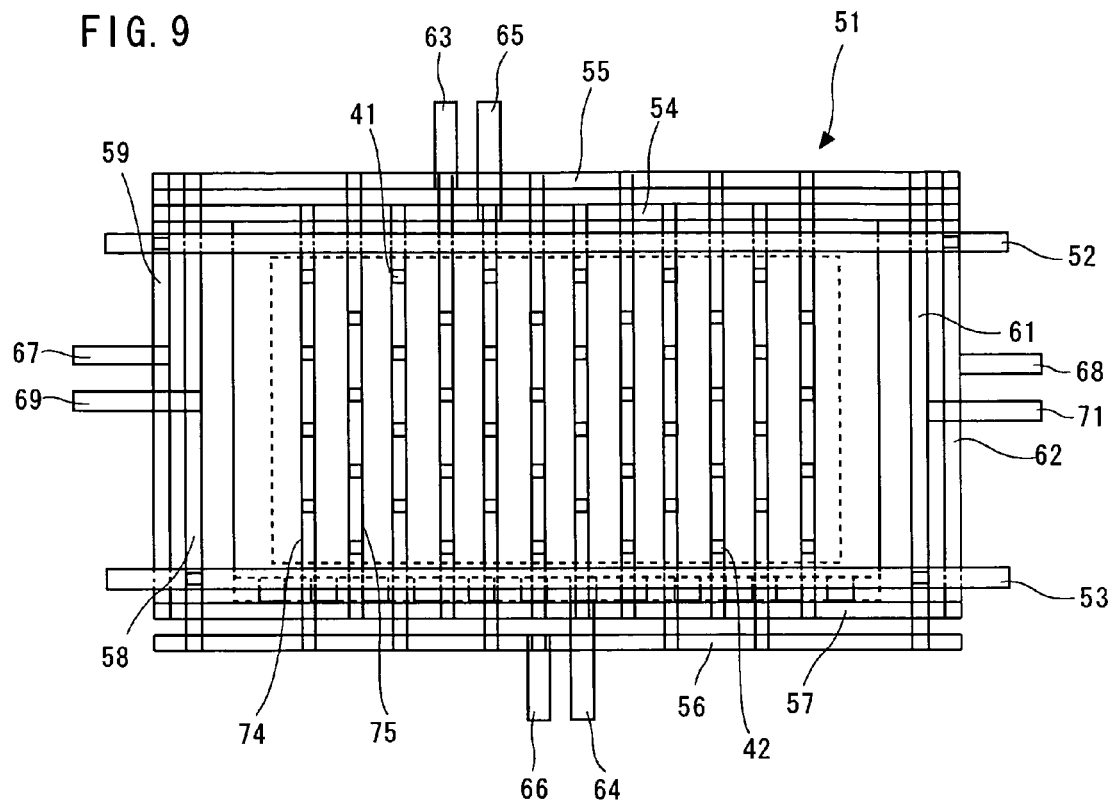
FIG. 9 is a process diagram depicting the same design method.
Figure 10:
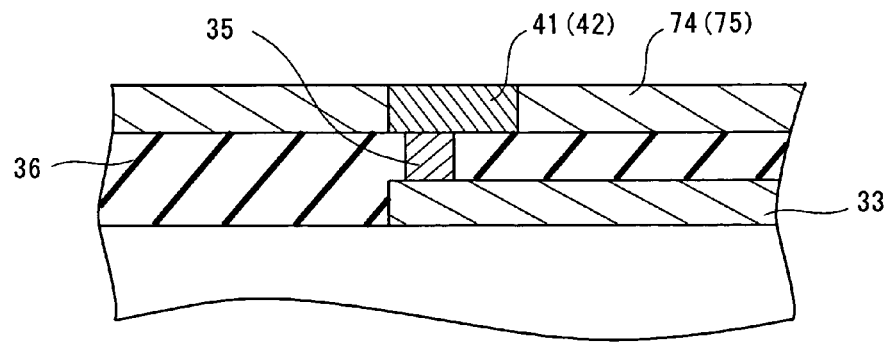
FIG. 10 is a diagram depicting the same design method.
Figure 11:
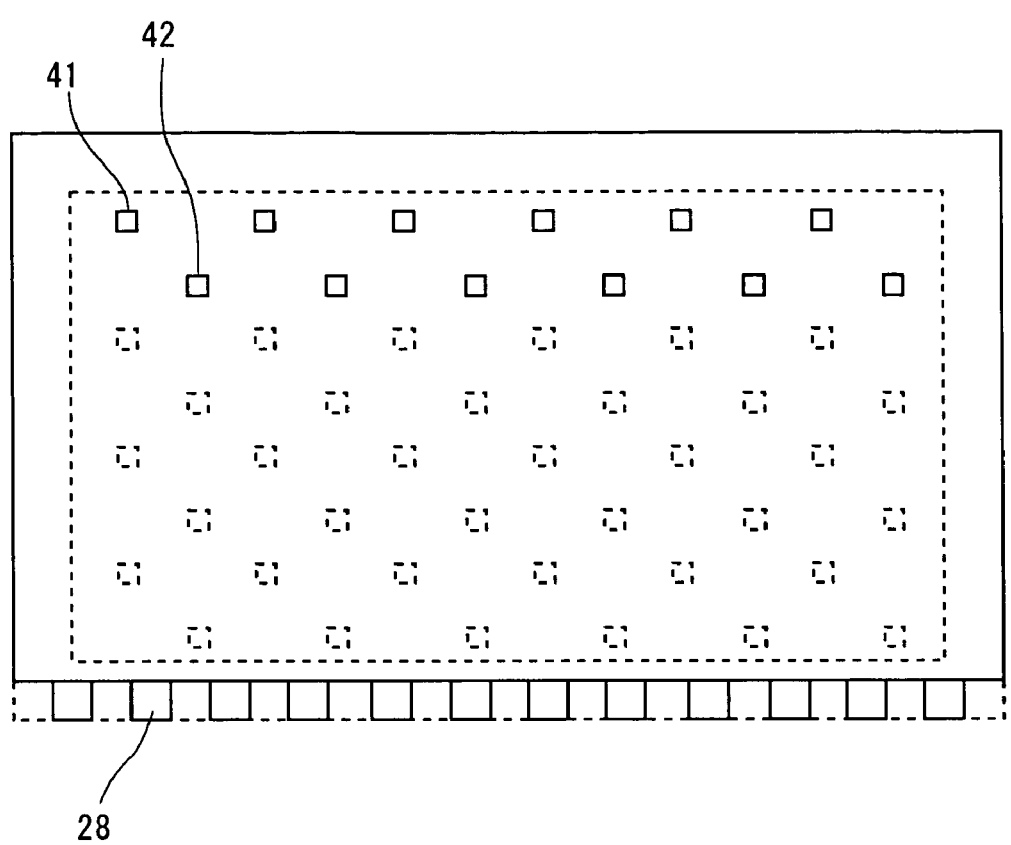
FIG. 11 is a diagram depicting the same design method.
Figure 12:
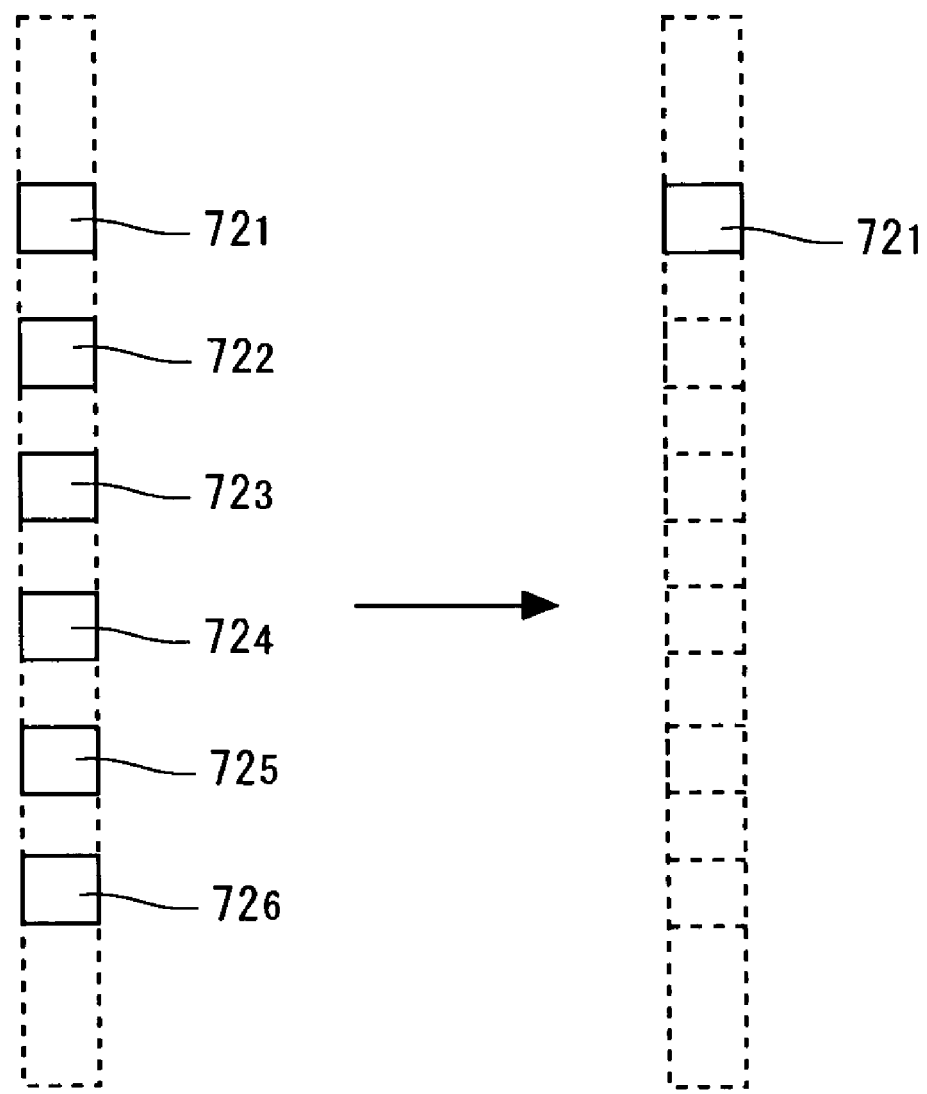
FIG. 12 is a process diagram depicting the same design method.
Figure 13:
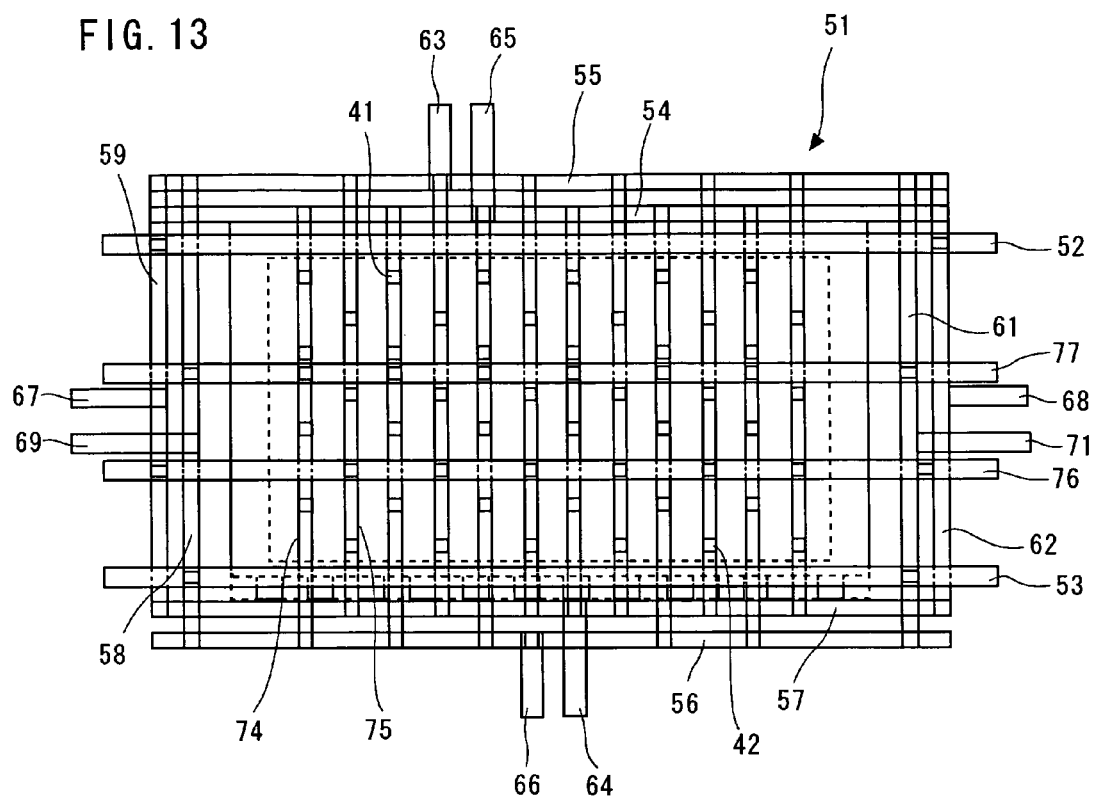
FIG. 13 is a process diagram depicting the same design method.

FIG. 1 is a flowchart depicting the semiconductor integrated circuit design method of first embodiment of the present invention; FIG. 2 is a block diagram depicting the structure of the design apparatus of the same semiconductor integrated circuit; FIGS. 3 through 6 are diagrams depicting an outline of the macrocell layout configuration in the same design method; FIGS. 7 through 9 are process diagrams depicting the same design method; FIGS. 10 through 12 are diagrams depicting the same design method; and FIG. 13 is a process diagram depicting the same design method.

This semiconductor integrated circuit design method is executed, for example, by means of a design support program for a semiconductor integrated circuit being incorporated into a design support device 21 for a semiconductor integrated circuit such as depicted in FIG. 2. A semiconductor integrated circuit on which a plurality of macrocells is mounted is thus designed. The macrocells thus mounted in this arrangement consist, for example, of SRAM or other memory macrocells, CPU macrocells, graphic display controller macrocells, and the like.

As depicted in the same figure, the design support device 21 is composed of a computer or other information processing device provided with a CPU-equipped controller 22, a storage unit 23, a display unit 24, and an operating unit 25.

The storage unit 23 consists of an internal storage device and an external storage device. The internal storage device consists of ROM, RAM, or other semiconductor memory. The external storage device consists of an FD driver equipped, for example, with an FD (flexible disk); an HD driver equipped with an HD (hard disk); an MO disk driver equipped with an MO (magnetic optical) disk; or a CD/DVD driver or the like equipped with a CD (compact disc)-ROM, CD-R (Recordable), CD-RW (ReWritable), DVD (Digital Video Disc)-ROM, DVD-R, DVD-RW, or the like.

The display unit 24 consists of a CRT display, liquid crystal display, plasma display, or the like. The operating unit 25 consists of a keyboard, mouse, or the like.

The above-mentioned semiconductor integrated circuit design method is stored as a design support program in an FD, HD, MO disk, CD-ROM, CD-R, CD-RW, DVD-ROM, DVD-R, DVD-RW, or other recording medium that is loaded into the corresponding external storage device, and is read and loaded into RAM at the time of execution. The recording medium may consist of ROM or another semiconductor memory.

A wiring tool or other design support program, as well as a library in which terminal information and the like relating to power terminals and ground terminals is described, are stored in the storage unit 23.

An overview of the layout specification of the macrocells in the semiconductor integrated circuit design method of this example will first be given with reference to FIGS. 3 through 6.

Figure 3:
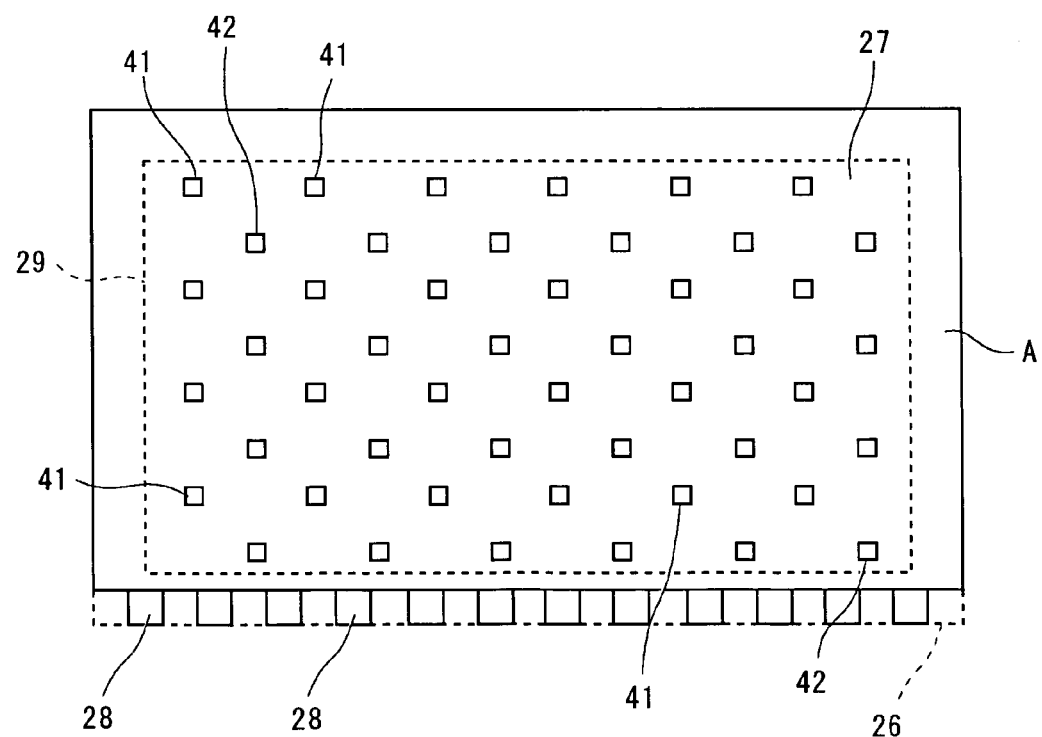
FIG. 3 is a diagram depicting an outline of the macrocell layout configuration in the same design method.

(1) The macro outer frame (outer frame) 26 consists of the substantially rectangular frame formed by the boundary of the rim of the core 27 or the extension thereof and the straight line obtained by connecting the leading ends of the plurality of input/output terminals 28, 28, . . . formed at the lower edge of the core 27 as depicted in FIG. 3. The transistor constituting the circuit of the macro is formed below the line layer within the outer frame 26. The input/output terminals 28 are formed, for example, at the lower rim of the core 27.

(2) The substantially square loop-shaped area formed against the perimeter frame 29, which is set a given distance inward from the macro outer frame 26, is designated as a wiring limit area A in which use of the line layer in the same layer as the orbital power ring 51 inside the core 27 is prohibited so as to enable at least a portion of the orbital power ring (loop line group) 51 to be accommodated. In the present example, use of the fourth and fifth line layers is prohibited in the wiring limit area A, and backtrack processing is performed as needed. Use of the first through third line layers is also allowed even if they are in the wiring limit area A. The transistor constituting the circuit of the macro is also formed below the wiring limit area A.

(3) Power terminals 41 and ground terminals 42 for connecting with the longitudinal power line (second power line) 74 and the longitudinal ground line (second ground line) 75 are formed in the fourth line layer in the same layer as the longitudinal power line 74 and longitudinal ground line 75 inside the core 27.

Figure 4:
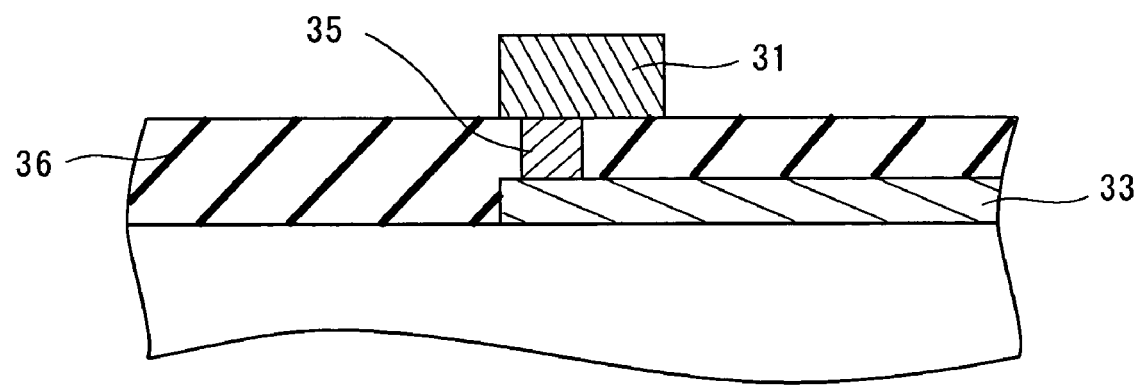
FIG. 4 is a diagram depicting an outline of the macrocell layout configuration in the same design method.

Specifically, the terminal 31 is formed in the fourth line layer directly above a given location in the line pattern 33 formed in the third line layer, and is connected with the line pattern 33 through a via-hole 35 as depicted in FIG. 4. "36" in the same figure indicates an insulation coating between the layers.

(4) The power terminals 41 and ground terminals 42 are arranged in rows of the same type of terminal, respectively, along the line direction of the longitudinal power line 74 and longitudinal ground line 75 so that at least a portion thereof overlaps with the longitudinal power line 74 and longitudinal ground line 75.

For example, the square-shaped power terminals 41 and ground terminals 42 are arranged in a checkered pattern such that the centers of terminals of the same type substantially coincide with the lattice points (in the present example, the arrangement consists of six rows with four terminals per row) as depicted in FIG. 3.

Figure 5:
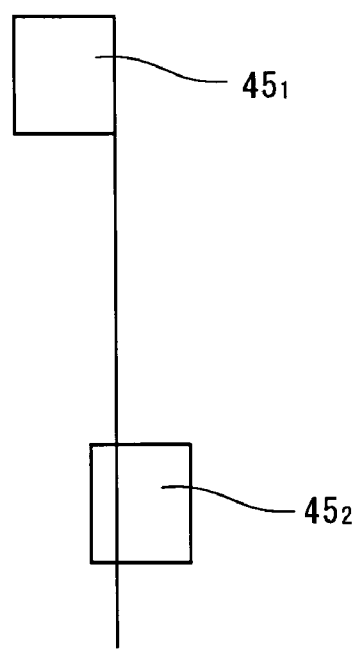
FIG. 5 is a diagram depicting an outline of the macrocell layout configuration in the same design method.
Figure 6:
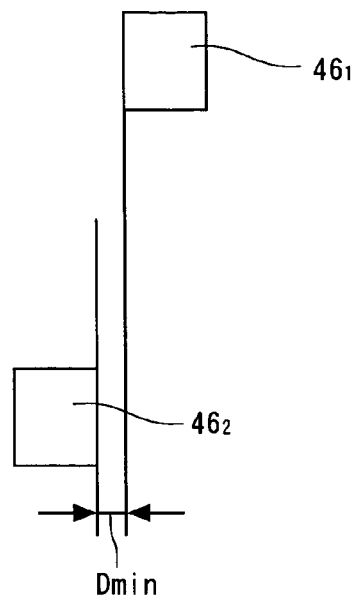
FIG. 6 is a diagram depicting an outline of the macrocell layout configuration in the same design method.

(5) The power terminals 41 and ground terminals 42 must be arranged so as to create as little unevenness as possible in the axis lines of terminals $45_1$ and $45_2$ of the same type that are adjacent to each other in the longitudinal or transverse directions as depicted in FIG. 5. In this case, the short ends of the terminals $45_1$ and $45_2$ are set as closely as possible to the same size.

(6) The minimum interval $D_{min}$ (see FIG. 6) between terminals $46_1$ and $46_2$ of the same or of different type adjacent to the extending direction or to the transverse direction follows the spacing rule of the wiring in the fourth layer.

(7) When the transverse ground bus 52 and transverse power bus 53 formed in the fifth layer are able to be used, these are set aside to constitute the orbital power ring 51 of the macrocells. The transverse ground bus 76 and transverse power bus 77, which are formed in the fifth layer and made to pass over the core 27, are connected as needed with the longitudinal power line 58, 61, and 74, and with the longitudinal ground line 59, 62, and 75, respectively, and a mesh-shaped power line structure is formed.

(8) The core 27 is in a rectangular or L-shape, and an irregular shape is not permitted.

(9) Pre-stored in the storage unit in advance as design units are the layout data about the macro outer frame 26, the macrocell interior, and the outer shape with the input/output terminals 28 of the macrocell, as well as the coordinates of the four corners of the rectangular line (corner points of the bus).

(10) Lines composed of aluminum, copper, or another metal coating can be used in the first through third layers, excluding the wiring limit area A.

The semiconductor integrated circuit design method of the present example will next be described with reference to the flowchart in FIG. 1 and to FIGS. 7 through 13.

The controller 22 first executes the processing of step SA11 depicted in FIG. 1, and arranges a macrocell in the desired position on the semiconductor chip on the basis of the semiconductor chip data and macrocell data read from the storage unit 23.

Specifically, placement of the macro outer frame 26 and core 27 of the macrocell on the semiconductor chip in the position desired by the operator is performed according to the manipulation of the operator (logical designer).

In this arrangement, the power terminals and ground terminals are arranged, for example, such that the centers of the square power terminals 41 and ground terminals 42 substantially coincide with the lattice points for terminals of the same type in a checkered pattern, and that terminals of a different type are not mixed in the same row.

The power terminals 41 and ground terminals 42 are also formed in the fourth line layer directly above given locations in the line pattern formed in the third line layer, and are connected with the line pattern through via-holes (see FIG. 4).

The controller 22 then forms the orbital power ring 51 in step SA12. Specifically, the controller 22 reads the information stored in the storage unit 23 for the chip internal power line composed of the transverse ground bus (chip internal ground line) 52 and transverse power bus (chip internal power line) 53 in a pair lined in the fifth layer, and when the transverse ground bus 52 and transverse power bus 53 are present near the macro outer frame 26 in the placement setting area of a given width from the top of the macro outer frame 26 upward and from the bottom thereof downward, these components are set as the transverse power line and transverse ground line constituting the quasi-orbital power ring 51, as depicted in FIG. 7.

In the present example, a transverse ground bus 52 and transverse power bus 53 are employed that pass within the wiring limit area A even when inside the macro outer frame 26.

The transverse ground bus 52 and transverse power bus 53 are composed of aluminum, copper, or another metal coating; have a given width (0.98 μm, for example); and are formed in a plurality of pairs at a given interval in the transverse direction of the figure.

The controller 22 also additionally arranges independent transverse power line or transverse ground line as depicted in the same figure within the above-mentioned placement setting area above or below the transverse ground bus 52 and transverse power bus 53 constituting the orbital power ring 51 when further placement of transverse power line or transverse ground line is possible.

For example, the controller 22 first determines whether or not three or two sets of transverse power line or transverse ground line having a short end of a pre-set length (0.55 μm, for example) can be lined at a pre-set pitch (1.15 μm, for example) in the fifth layer between the detected transverse ground bus 52 and transverse power bus 53 and the macro outer frame 26 of the above-mentioned macrocell.

When three or two sets of transverse power line or transverse ground line can be lined between the transverse ground bus 52 and transverse power bus 53 and the macro outer frame 26 of the above-mentioned macrocell, the controller 22 lines three or two sets of transverse power line or transverse ground line.

The transverse power line or transverse ground line consists of a pair of transverse power line or transverse ground line in the case of two sets, and consists of one set of either transverse power line or transverse ground line and two sets of the other type in the case of three sets.

In contrast, when transverse power line or transverse ground line cannot be lined between the transverse ground bus 52 and transverse power bus 53 and the macro outer frame 26 of the above-mentioned macrocell, the controller 22 lines a pair of transverse power line (first power line) 54 (57) and transverse ground line (first ground line) 55 (56) on the opposite side of the macro outer frame 26 from the transverse ground bus 52 and transverse power bus 53, for example, as depicted in the same figure. In either case, ground line is lined alternately with power line.

When there are none of the transverse ground bus and transverse power bus that can be set aside for use in the placement setting area, transverse power line and transverse ground line are arranged independently in the above-mentioned placement setting area.

The controller 22 then forms the longitudinal power line and longitudinal ground line and connects the transverse power line and transverse ground line with the longitudinal power line and longitudinal ground line.

Specifically, the controller 22 first lines longitudinal power line 58 (61) and longitudinal ground line 59 (62) in a pair having a short end of a pre-set length (0.55 μm, for example) at a pre-set pitch (1.15 μm, for example) in the fourth layer in a placement setting area of a given width that includes the left and right ends of the macro outer frame 26, as depicted in the same figure.

The controller 22 then connects the longitudinal ground line 59 and 62, the transverse ground line 55 and 56, and the transverse ground bus 52 through a via-hole, and connects the longitudinal power line 58 and 61, the transverse power line 54 and 57, and the transverse power bus 53 through a via-hole.

The controller 22 then defines the area in which the orbital power ring 51 is generated as a reserved no-wiring area to indicate that this area has already been reserved, so that another macrocell is not placed therein. Furthermore, the controller 22 designates a given area around the macro outer frame 26 (for example, a substantially box-shaped area extending 1.51 μm from each side of the macro outer frame 26) as an area in which another macrocell does not exist.

The controller 22 then performs terminal processing of the chip internal power line in step SA13. Specifically, the controller 22 causes the terminal longitudinal ground bus 63 of the fourth layer to reach the bottom of the intersecting transverse ground line 55 of the fifth layer and performs connection and termination through the via-hole, and causes the terminal longitudinal ground bus 64 of the fourth layer to reach the bottom of the intersecting transverse ground line 56 of the fifth layer and performs connection and termination through the via-hole, as depicted in FIG. 8.

In the same manner, the controller 22 causes the terminal longitudinal power bus 65 of the fourth layer to reach the bottom of the intersecting transverse power line 54 of the fifth layer and performs connection and termination, and causes the terminal longitudinal power bus 66 of the fourth layer to reach the bottom of the intersecting transverse power line 57 of the fifth layer and performs connection and termination through the via-hole.

The controller 22 also causes the ground follow pin 67 of the first layer to reach the bottom of the intersecting longitudinal ground line 59 of the fourth layer, and performs connection and termination through the via-hole, and causes the ground follow pin 68 of the first layer to reach the intersecting longitudinal ground line 62 of the fourth layer, and performs connection and termination through the via-hole.

In the same manner, the controller 22 causes the power follow pin 69 of the first layer to reach the bottom of the intersecting longitudinal power line 58 of the fourth layer, and performs connection and termination through the via-hole, and causes the power follow pin 71 of the first layer to reach the intersecting longitudinal power line 61 of the fourth layer, and performs connection and termination through the via-hole.

The controller 22 then identifies the power terminals and ground terminals of the macrocell in step SA14. Specifically, the controller 22 retrieves the locations stored in the storage unit 23 for one terminal in each row (in the present example, the terminals shown in solid line at the top of the figure) among the power terminals 41 and ground terminals 42 formed in the fourth layer in the macrocell as depicted in FIG. 11, and identifies these locations in the hereinafter described step SA15 as those of the power terminals 41 and ground terminals 42 to be connected via the longitudinal power line 74 or longitudinal ground line 75 with the transverse power bus 53 and transverse power line 54 and 57 constituting the orbital power ring 51, or the transverse ground bus 52 and transverse ground line 55 and 56.

In the present example, the information for only one terminal 72, out of the plurality of terminals $72_1$, $72_2$, ... constituting the group of terminals lined up in one row is defined in the above-mentioned terminal information library as depicted in FIG. 12, and defining of information for other terminals $74_2$, $72_3$, ... in the same row is omitted.

The controller 22 then connects the orbital power ring 51 with the power terminals 41 and the ground terminals 42 in step SA15. Specifically, the controller 22, according to the defined positions of the power terminals 41 identified in the processing of step SA14, first configures the orbital power ring 51 generated by the processing of step SA12 and forms in the extending direction of the fourth layer in FIG. 9 (for example, along the extension direction of the longitudinal power line 58 and 61) the longitudinal power line 74 of the same line width as one side of the power terminals 41 over a section that starts at the bottom surface of the transverse power line 54 formed in the fifth layer, passes underneath the transverse ground bus 52, and reaches the bottom surface of the transverse power line 57, so as to overlap with the power terminals 41 that form a row in the same layer as depicted in FIGS. 9 and 10.

Whereupon, the controller 22 connects each longitudinal power line 74 with the longitudinal power line 58, transverse power bus 53, and transverse power line 57 at their intersection points through the via-holes. The controller 22 also directly connects, from among the plurality of sets of longitudinal power line 74, the longitudinal power line 74 in which the terminal longitudinal power buses 65 and 66 lie on the extension thereof, with the terminal longitudinal power buses 65 and 66 thereof.

In the same manner, the controller 22, according to the defined positions of the ground terminals 42 identified in the processing of step SA14, configures the orbital power ring 51 generated by the processing of step SA12 and forms in the extending direction of the fourth layer in FIG. 9 (for example, along the extension direction of the longitudinal ground line 59 and 62) the longitudinal ground line 75 of the same line width as one side of the ground terminals 42 over a section that starts at the bottom surface of the transverse ground line 55 formed in the fifth layer, passes underneath the transverse ground bus 52 and the transverse power line 54, and reaches the bottom surface of the transverse ground line 56, so as to overlap with the ground terminals 42 that forms a row in the same layer as depicted in FIGS. 9 and 10.

Whereupon, the controller 22 connects each longitudinal ground line 75 with the transverse ground line 55, transverse ground bus 52, and transverse ground line 56 at their intersection points through the via-holes. The controller 22 also directly connects, from among the plurality of sets of longitudinal ground line 75, the longitudinal ground line 75 in which the terminal longitudinal ground buses 63 and 64 lie on the extension thereof, with the terminal longitudinal ground buses 63 and 64 thereof.

With the controller 22, in step SA16 as shown in FIG. 13, the transverse ground bus 76 and transverse power bus 77, which are formed in the fifth layer and made to pass over the core 27, are then connected with the longitudinal power line 58, 61, and 74, and the longitudinal ground line 59, 62, and 75, respectively, through via-holes at their intersection points; a mesh-shaped power line structure is formed; and the processing sequence is completed.

By means of the configuration of the present example, the power terminals 41 and ground terminals 42 are formed in the same layer as the longitudinal ground line 75 and the longitudinal power line 74, whereby the longitudinal ground line 75 and longitudinal power line 74 are simply stacked on top of each other, and the time required to generate the position information and the like of the through-holes can be saved and design can be carried out quickly because the power terminals 41 and ground terminals 42 can be connected and formation of through-holes can be rendered unnecessary in the wiring process of the longitudinal ground line 75 and the longitudinal power line 74.

Formation of through-holes can also be rendered unnecessary, so the possibility of design error occurring in the layout can also be reduced.

There is also no need to store the position information of the through-holes used in this wiring process, so the storage capacity of the storage unit 23 can be reduced.

The power terminals 41 and ground terminals 42 are also formed in the same layer as the longitudinal ground line 75 and the longitudinal power line 74, and the square power terminals 41 and ground terminals 42 are arranged in a checkered pattern so that the centers of terminals of the same type substantially coincide with the lattice points, allowing wiring to be performed as long as the position defined for one terminal in each row is known among the power terminals 41 and ground terminals 42.

Consequently, the amount of information defined in the terminal information library can be greatly reduced (for example, when granular terminals are arranged in 100 lines in 100 rows, it becomes possible to omit definition of a maximum of approximately 96% of the terminals), and the storage capacity of the storage unit 23 can be reduced. Furthermore, design can be performed quickly because the search time and the like of the terminal information library can also be shortened.

Placement of the orbital power ring 51 internally in the macrocell is made possible by prohibiting the use of the line layers in a substantially square loop-shaped area formed against the perimeter frame 29, which is set a given distance inward from the macro outer frame 26, so that at least a portion of the orbital power ring can be placed therein, allowing the size of the orbital power ring 51 to be reduced and the interval between neighboring macrocells to be shortened, whereby the density with which macrocells can be mounted on the semiconductor chip can be enhanced, and miniaturization of the surface area of the semiconductor chip can be achieved.

A configuration is also adopted whereby the transverse ground bus 76 and transverse power bus 77 passing through the top of the core 27 are connected through via-holes with the longitudinal power line 58, 61, and 74, and the longitudinal ground line 59, 62, and 75, respectively, at the intersection points thereof, and a mesh-shaped power line structure is formed, so wiring obstacles can be reduced, and a high current supply capability can be maintained regardless of the shape of the macrocell. Voltage drops in the line can also be minimized.

Second Embodiment

Figure 14:
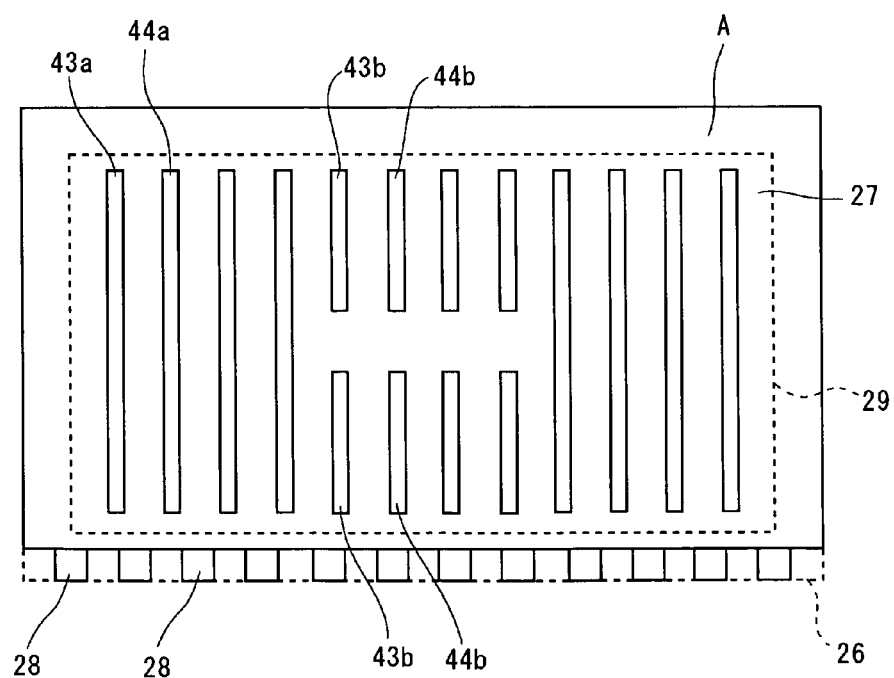
FIG. 14 is a diagram depicting an overview of the macrocell layout configuration in the semiconductor integrated circuit design method of the second embodiment of the present invention.

FIG. 14 is a diagram depicting an overview of the macrocell layout configuration in the semiconductor integrated circuit design method of the second embodiment of the present invention.

The aspect of the present example that differs significantly from the first embodiment is that the power terminals and ground terminals are arranged in a row of elongated strips.

Other aspects of this configuration are substantially the same as in the above-mentioned first embodiment, and description thereof is omitted.

In the present example, elongated strip-shaped power terminals 43a and 43b and ground terminals 44a and 44b are set in an array as depicted in FIG. 14. In this arrangement, the power terminals 43a and 43b and ground terminals 44a and 44b are disposed along the same rows (along the extension direction of the longitudinal power line (second power line) and longitudinal ground line (second ground line)) so that terminals of differing types are not mixed.

By means of the configuration of the present example, virtually the same effects as in the above-mentioned first embodiment can be obtained.

In addition, wiring inside the macrocell can be performed using the line layer of the fourth layer in the same layer as the power terminals 43a and 43b and ground terminals 44a and 44b in an area other than on the rows in which the power terminals 43a and 43b and ground terminals 44a and 44b are arrayed, so a portion of the macrocell internal line that was conventionally formed using the line layer disposed under the layer in which the power terminals and ground terminals are formed can be formed using the line layer of the fourth layer, whereby the wiring area per layer can be reduced, the surface area of the macrocell can be contracted, and miniaturization of the surface area of the semiconductor chip can be achieved. The latitude of design flexibility can also be enhanced by increasing the usable wiring area.

Third Embodiment

Figure 15:
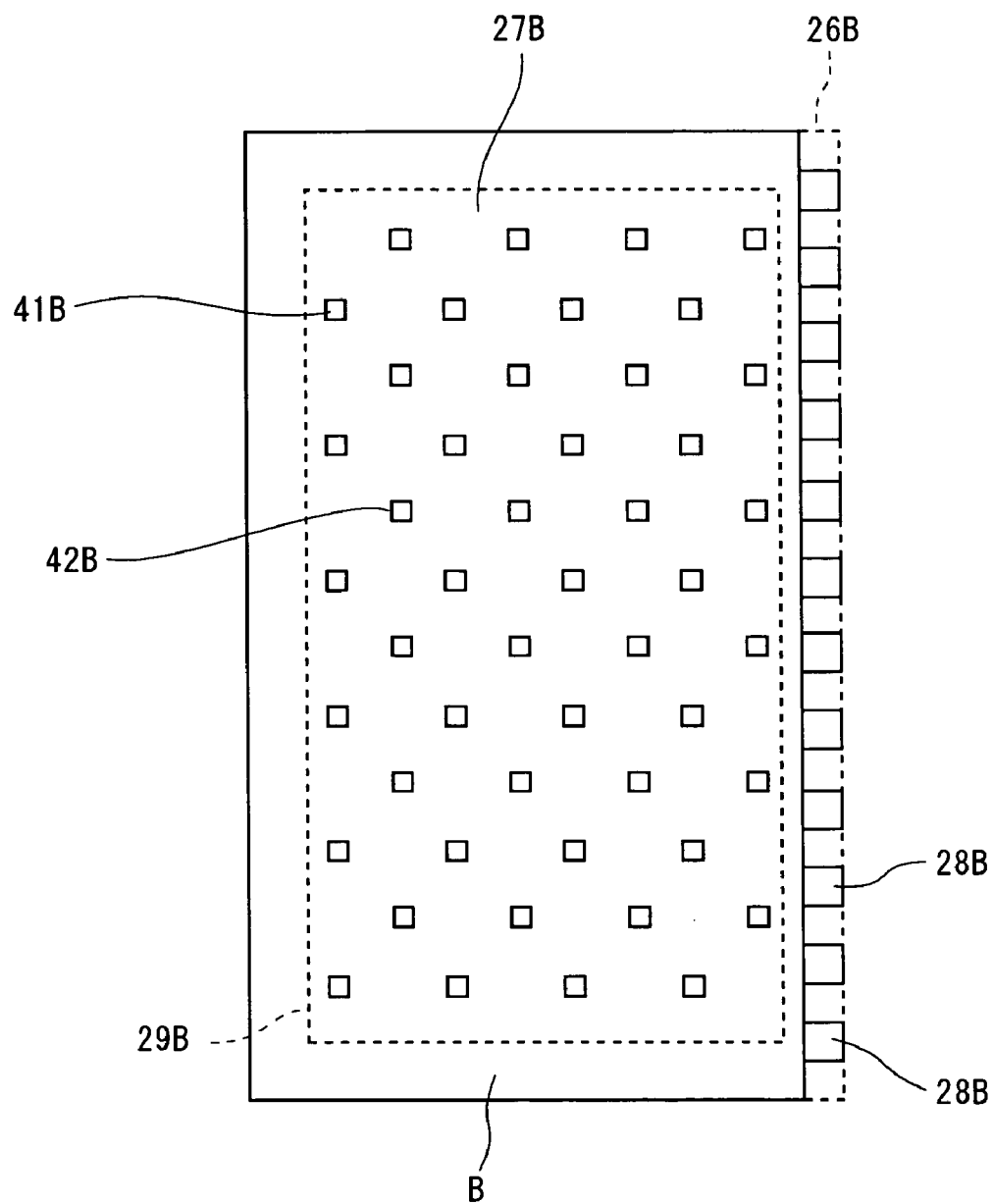
FIG. 15 is a diagram depicting an overview of the macrocell layout configuration in the semiconductor integrated circuit design method of the third embodiment of the present invention.
Figure 16:
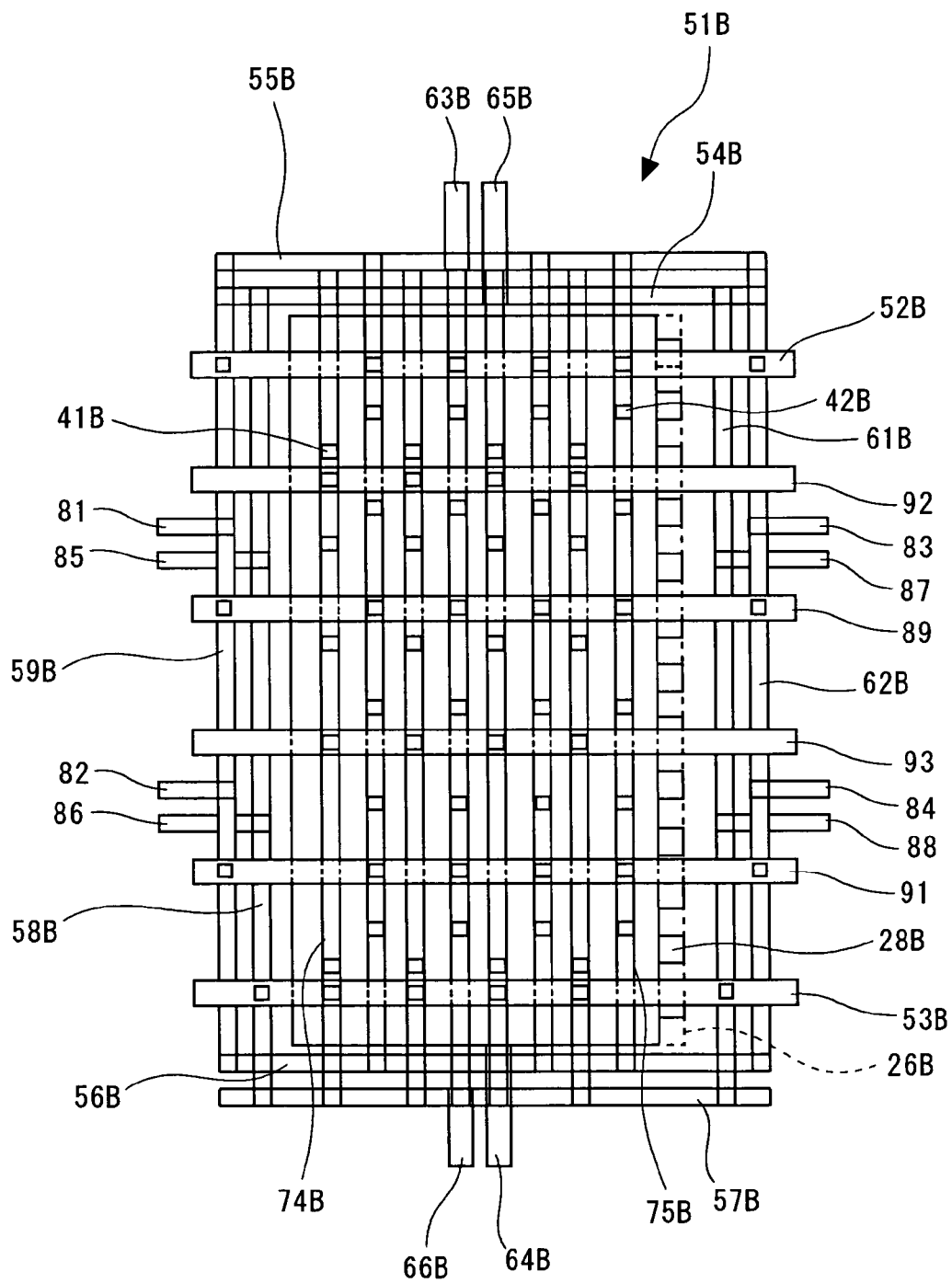
FIG. 16 is a diagram depicting the same design method.
Figure 17:
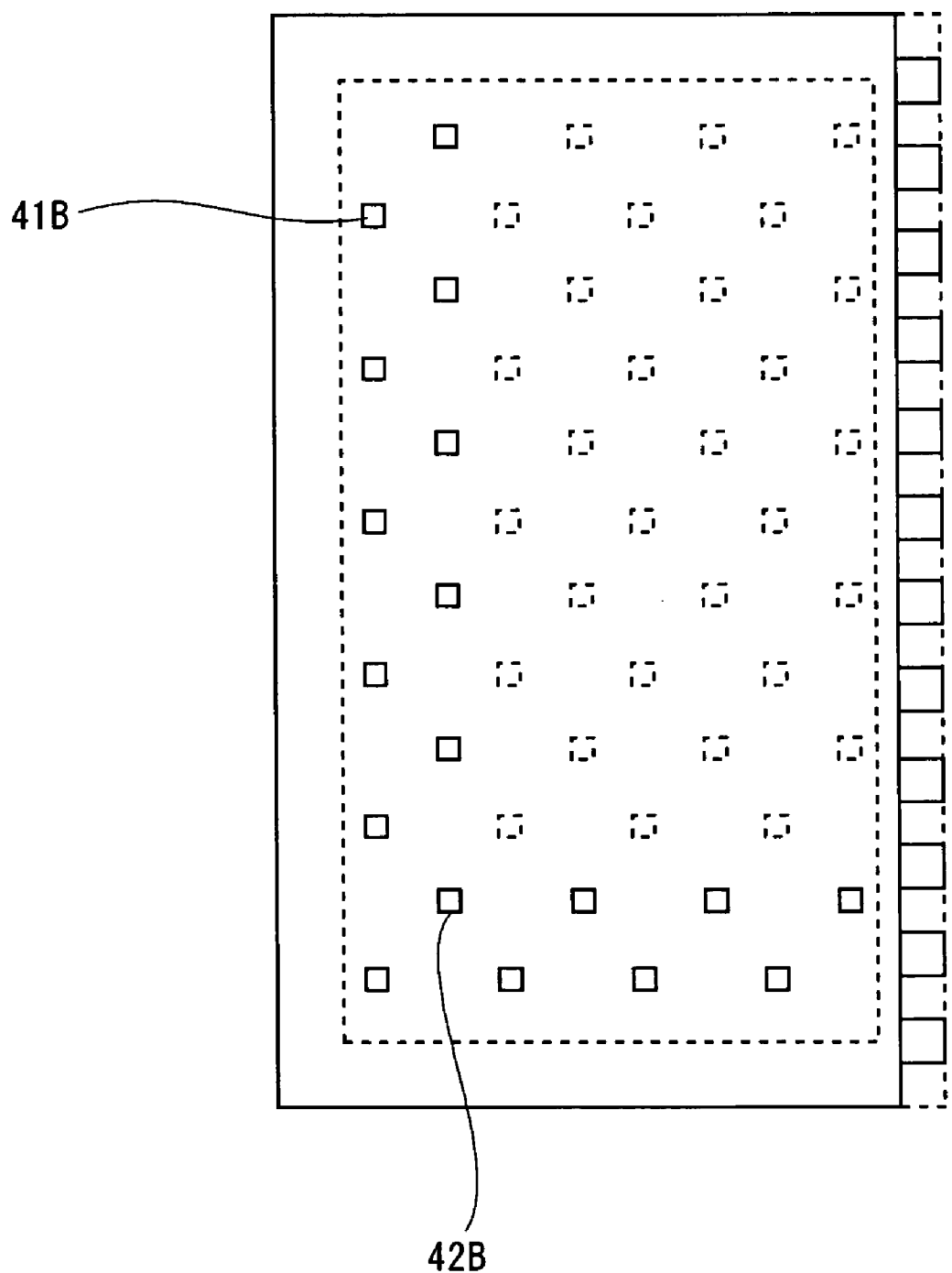
FIG. 17 is a diagram depicting the same design method.
Figure 18:
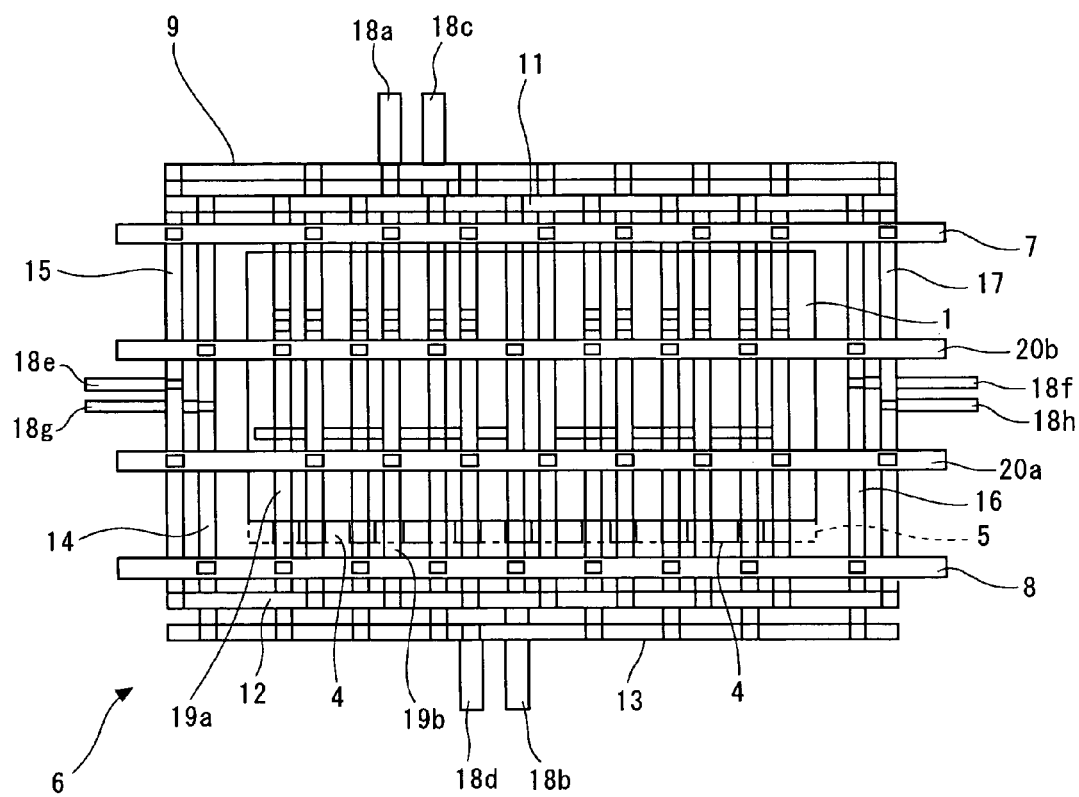
FIG. 18 is a diagram depicting the conventional technique.
Figure 19:
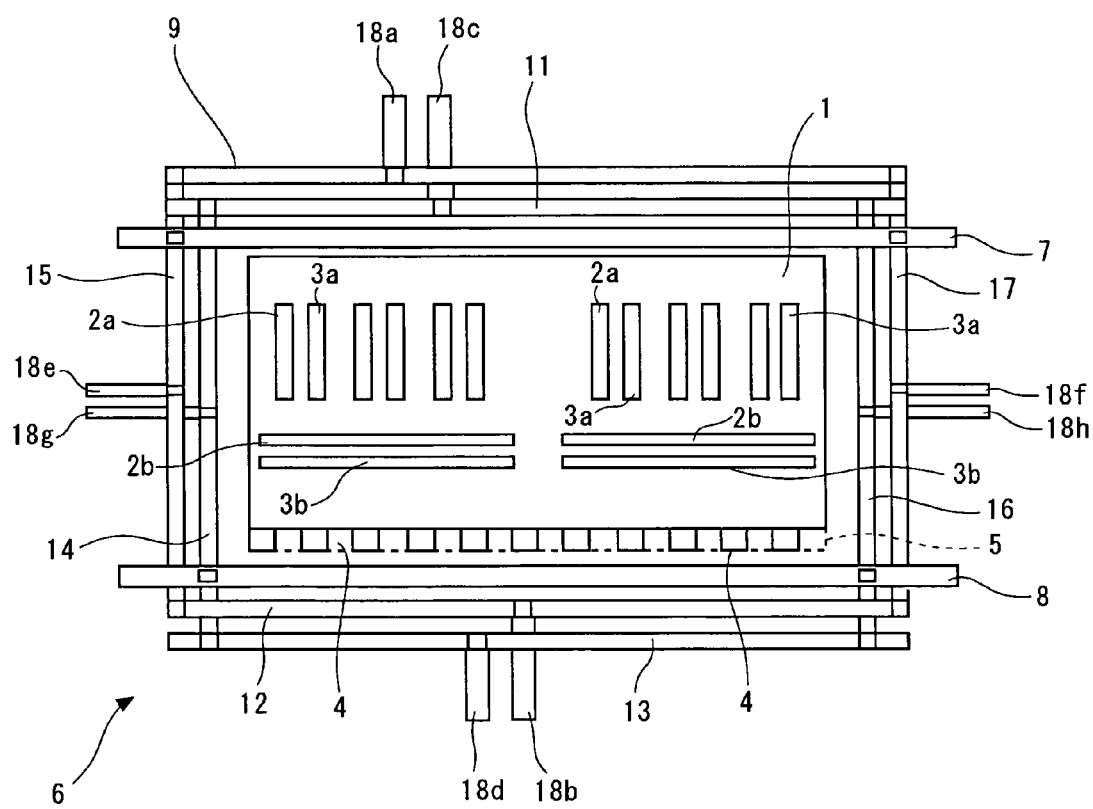
FIG. 19 is a diagram depicting the conventional technique.
Figure 20:
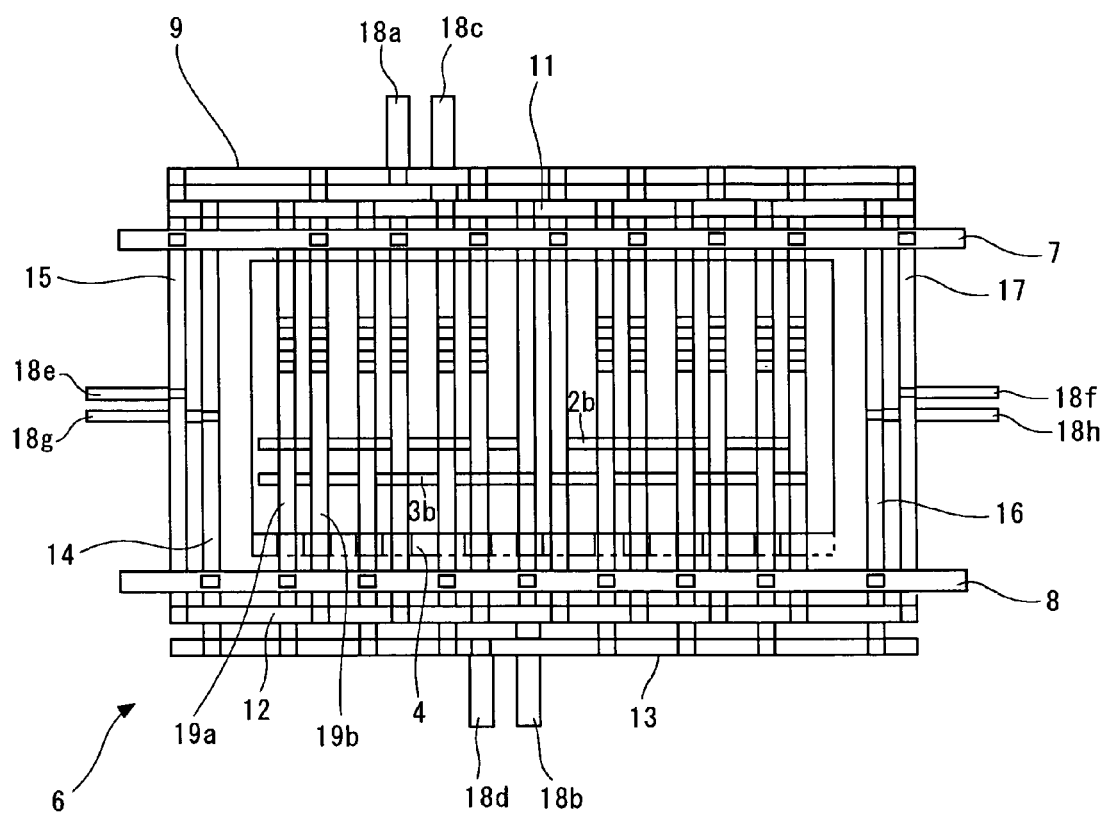
FIG. 20 is a diagram depicting the conventional technique.

FIG. 15 is a diagram depicting an outline of the layout configuration of the macrocell in the semiconductor integrated circuit design method of the third embodiment of the present invention, and FIGS. 16 and 17 are diagrams depicting the same design method.

The aspect of the present example that differs significantly from the first embodiment is that the layout patterns of the power terminals and ground terminals are mirror images of each other in the macrocells, and a configuration is adopted that applies the same data (for example, layout data and terminal information data).

Specifically, in the present example, the same method is applied as in the first embodiment and a semiconductor integrated circuit is designed in a case in which the macrocells are arranged as they are on the semiconductor chip without being rotated (regular arrangement as described in the first embodiment), as well as in a case in which the macrocells are rotated by a given angle and arranged on the semiconductor chip, for example (see FIG. 15).

In this regard, the configuration of the terminal information file for the macrocells differs from the description given in the first embodiment. For example, to enable rotated placement, information is defined in the terminal information library for at least one terminal in each line and row among the power terminals and ground terminals arranged in a checkered pattern (see FIG. 17).

Other aspects of this configuration are substantially the same as in the above-mentioned first embodiment, and description thereof is omitted.

Regular placement in which the macrocells are arranged on the semiconductor chip using the macrocell data (layout data and terminal information data, for example) contained in the design board data without being rotated, and rotated placement in which rotation by a given angle (90°, 180°, and 270°) and placement on the semiconductor chip are performed, can be applied in this semiconductor integrated circuit design method, but a case will be described hereinafter as an example in which rotation by 90° and placement on the semiconductor chip are performed.

In this example, the macro outer frame 26B consists of a substantially rectangular frame formed by the boundary of the rim of the core 27B or the extension thereof and the straight line obtained by connecting the leading ends of the plurality of input/output terminals 28B, 28B, . . . formed at the edge of the right side of the core 27B, as depicted in FIG. 15. The input/output terminals 28B are formed only at the edge of the right side of the core 27B.

The substantially square loop-shaped area formed against the perimeter frame 29B, which is set a given distance inward from the macro outer frame 26B, is designated as a wiring limit area B in which use of the line layers is prohibited so as to enable at least a portion of the orbital power ring (loop line group) to be accommodated.

As depicted in the same figure, terminals of the same type among the square power terminals 41B and ground terminals 42B are also arranged in a checkered pattern so that the centers thereof substantially coincide with the lattice points (in the present example, the terminals are arranged in four rows of six terminals each).

The semiconductor integrated circuit design method of the present example will next be described with reference to FIGS. 16 and 17.

First, the controller 22 arranges the macrocells in the desired positions on the semiconductor chip on the basis of the semiconductor chip data and macrocell data read from the storage unit 23 in the same manner as in the first embodiment.

In this arrangement, the power terminals and ground terminals are arranged, for example, such that the centers of the square power terminals 41B and ground terminals 42B substantially coincide with the lattice points for terminals of the same type in a checkered pattern, and that terminals of a different type are not mixed in the same row.

The power terminals 41B and ground terminals 42B are also formed in the fourth line layer directly above given locations in the line pattern formed in the third line layer, and are connected with the line pattern through via-holes.

The controller 22 then forms the orbital power ring 51B as depicted in FIG. 16. Specifically, the controller 22 reads the information stored in the storage unit 23 for the chip internal power line composed of the transverse ground bus 52B and transverse power bus 53B in a pair lined in the fifth layer, and when the transverse ground bus 52B and transverse power bus 53B are present near the macro outer frame 26B in the placement setting area of a given width from the top of the macro outer frame 26B upward and from the bottom thereof downward, these components are set as the transverse power line and transverse ground line constituting the quasi-orbital power ring 51B, as depicted in the same figure.

In the present example, a transverse ground bus 52B and transverse power bus 53B are also employed that pass within the wiring limit area B even when inside the macro outer frame 26B.

Also in the present example, the controller 22 additionally arranges independent transverse power line 54B (57B) and transverse ground line 55B (56B) as depicted in the same figure within the above-mentioned placement setting area above the transverse ground bus 52B and below the transverse power bus 53B constituting the orbital power ring 51B.

The controller 22 then lines longitudinal power line 58B (61B) and longitudinal ground line 59B (62B) in pairs in the fourth layer within a placement setting area of a given width that includes the left side and right side of the macro outer frame 26B, as depicted in the same figure.

The controller 22 then connects the longitudinal ground line 59B and 62B, the transverse ground line 55B and 56B, and the transverse ground bus 52B through a via-hole, and connects the longitudinal power line 58B and 61B, the transverse power line 54B and 57B, and the transverse power bus 53B through a via-hole.

The controller 22 then defines the area in which the orbital power ring 51B is generated as a reserved no wiring area to indicate that this area has already been reserved, so that another macrocell is not placed therein. Furthermore, the controller 22 designates a given area around the macro outer frame 26B as an area in which another macrocell does not exist.

The controller 22 then connects and terminates the terminal longitudinal ground bus 63B in the fourth layer at the bottom of the transverse ground line 55B through the via-hole, and connects and terminates the terminal longitudinal ground bus 64B at the bottom of the transverse ground line 56B through the via-hole.

In the same manner, the controller 22 connects and terminates the terminal longitudinal power bus 65B at the bottom of the transverse power line 54B through the via-hole, and connects and terminates the terminal longitudinal power bus 66B at the bottom of the transverse power line 57B through the via-hole.

The controller 22 also connects and terminates the ground follow pins 81 and 82 at the bottom of the longitudinal ground line 59B through the via-hole, and connects and terminates the ground follow pins 83 and 84 at the bottom of the longitudinal ground line 62B through the via-hole.

In the same manner, the controller 22 connects and terminates the power follow pins 85 and 86 at the bottom of the longitudinal power line 58B through the via-hole, and connects and terminates the power follow pins 87 and 88 at the bottom of the longitudinal power line 61B through the via-hole.

The controller 22 then identifies the power terminals and ground terminals of the macrocell. Specifically, the controller 22 retrieves, from the terminal information library stored in the storage unit 23, the defined location of the power terminal 41B in the bottom line of the leftmost row from among the power terminals 41B, and the defined location of the ground terminal 42B in the bottom line of the leftmost row from among the ground terminals 42B formed in the fourth layer in the macrocell as depicted in FIG. 17, and identifies these locations as those of the power terminal 41B and ground terminal 42B to be connected via the longitudinal power line 74B or longitudinal ground line 75B with the transverse power bus 53B and transverse power line 54B and 57B, or the transverse ground bus 52B and transverse ground line 55B and 56B.

In the present example, in the above-mentioned terminal information library, information is defined only for the power terminal 41B and ground terminal 42B shown in solid line in the bottom line of the leftmost row, and definition of information is omitted for the other terminals shown in dashed line, as depicted in the same figure.

In the present example, information about the terminals that can be set aside also contains not only information about the power terminal at the topmost line among the power terminals and the ground terminal at the topmost line among the ground terminals, but also information about the power terminal in the leftmost row among the power terminals and the ground terminal in the leftmost row among the ground terminals.

The controller 22, according to the defined positions of the power terminals 41B thus identified, then configures the orbital power ring 51B and forms in the extending direction of the fourth layer in FIG. 16 (for example, along the extension direction of the longitudinal power line 58B and 61B) the longitudinal power line 74B of the same line width as one side of the power terminals 41B from the bottom surface of the transverse power line 54B formed in the fifth layer to the bottom surface of the transverse power line 57B, so as to overlap with the power terminals 41B that form a row in the same layer, as depicted in FIG. 16.

Whereupon, the controller 22 connects each longitudinal power line 74B with the transverse power line 54B, transverse power bus 53B, and transverse power line 57B at their intersection points through the via-holes. The controller 22 also directly connects, from among the plurality of sets of longitudinal power line 74B, the longitudinal power line 74B in which the terminal longitudinal power buses 65B and 66B lie on the extension thereof, with the terminal longitudinal power buses 65B and 66B thereof.

In the same manner, the controller 22, according to the defined positions of the power terminals 42B thus identified, configures the orbital power ring 51B and forms in the extending direction of the fourth layer in the same figure (for example, along the extension direction of the longitudinal ground line 59B and 62B) the longitudinal ground line 75B of the same line width as one side of the ground terminals 42B from the bottom surface of the transverse ground line 55B formed in the fifth layer to the bottom surface of the transverse ground line 56B, so as to overlap with the ground terminals 42B forming a row in the same layer.

Whereupon, the controller 22 connects each longitudinal ground line 75B with the transverse ground line 55B, transverse ground bus 52B, and transverse ground line 56B at their intersection points through the via-holes. The controller 22 also directly connects, from among the plurality of sets of longitudinal ground line 75B, the longitudinal ground line 75B in which the terminal longitudinal ground buses 63B and 64B lies on the extension thereof, with the terminal longitudinal ground buses 63B and 64B thereof.

With the controller 22, the transverse ground buses 89 and 91 and transverse power buses 92 and 93, which are formed in the fifth layer and made to pass over the core 27B, are then connected with the longitudinal ground line 59B, 62B, and 75B, and the longitudinal power line 58B, 61B, and 74B, respectively, through via-holes at their intersection points as depicted in the same figure; a mesh-shaped power line structure is formed; and the processing sequence is completed.

By means of the configuration of the present example, virtually the same effects as in the above-mentioned first embodiment can be obtained.

In addition, the arrangement pattern of the power terminals and ground terminals in the macrocells of the present example has a mirror-image relationship when the macrocells are arranged on the semiconductor chip without being rotated and when the macrocells are rotated 90°, for example, and arranged on the semiconductor chip; and for terminals of the same type, the power terminals and ground terminals are arranged in a checkered pattern so that their centers substantially coincide with the lattice points, and the terminal information file is configured according to the rotated placement of the macrocells (see FIG. 17), so the macrocells can be arranged on the semiconductor chip using exactly the same macrocell data (for example, layout data and terminal information data) regardless of the arrangement attributes (rotated 90°, for example) of the macrocells on the semiconductor chip, and power line to the macrocells can be executed by exactly the same method (steps SA11 through SA16).

The latitude of flexibility in macrocell arrangement and layout on the semiconductor chip can thus be enhanced with comparatively low design expenditure. By the above-mentioned method, the storage capacity of the storage unit 23 can be reduced when arranging a plurality of macrocells with the same shape on a semiconductor chip.

Embodiments of the present invention are described above with reference to the figures, but the specific structure of the present invention is not limited by the embodiments, and modifications and the like to the design thereof that do not depart from the essence of the present invention are also encompassed in the present invention.

For example, a memory macrocell was used as an example of a macrocell being laid out in the embodiments described above, but the present invention is not limited by these examples, and the macrocell may also consist of a CPU macrocell, graphic display controller macrocell, or other such macrocell.

In the first embodiment, a case was described in which the uppermost terminal of each row in the arrangement was selected among the power terminals 41 and ground terminals 42 and defined in the terminal information library, but this selection is not limited to the uppermost terminal, and a plurality of terminals may also be selected from the rows.

In the third embodiment, a design method was described for a semiconductor integrated circuit with macrocells that are rotated 90° counterclockwise from their original positions, but this 90-degree rotation is not limiting, and the macrocells may also be rotated 180° or 270°, and may be mirror-reversed about the X- or Y-axis.

Regular arrangement alone may also be performed in the third embodiment, whereby the macrocells are arranged on the semiconductor chip in unmodified form (without being rotated) using the macrocell data contained in the design board data; rotated arrangement alone may also be performed, whereby the macrocells are rotated by a given angle (90°, 180°, and 270°) and arranged on the semiconductor chip; and a combination of regular arrangement and rotated arrangement may also be performed.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An automatic wiring method for a semiconductor integrated circuit used to form a semiconductor integrated circuit for performing a desired operation by laying out and interconnecting a plurality of macrocells, each implementing a given function on a semiconductor chip, the method comprising:
   (a) a step of arranging a macrocell, in which a plurality of power terminals and a plurality of ground terminals are formed on a line layer, on the semiconductor chip;
   (b) a step of forming a loop line group containing a first power line and a first ground line for supplying power to the macrocell along an outer frame of the macrocell; and
   (c) a step of connecting a corresponding one of the plurality of power terminals with the first power line through a second power line arranged on said line layer, and connecting a corresponding one of the plurality of ground terminals with the first ground line through a second ground line arranged on said line layer.

2. The automatic wiring method for a semiconductor integrated circuit according to claim 1, wherein the plurality of power terminals and the plurality of ground terminals are arranged in a plurality of rows along an extending direction of the second power line and the second ground line wired in the step (c), so as to at least partially overlap with the second power line and the second ground line, in the macrocell arranged on the semiconductor chip in the step (a), and only the same type of terminals in the plurality of power terminals or the plurality of ground terminals of each row are arranged in a straight line along the extending direction.

3. The automatic wiring method for a semiconductor integrated circuit according to claim 2, wherein the second power line and the second ground line are arranged in the step (c) based on information in which at least one of either the plurality of power terminals or the plurality of ground terminals in corresponding rows is defined.

4. The automatic wiring method for a semiconductor integrated circuit according to claim 1, wherein a part of an internal line layer of the macrocell is formed in the same layer as the plurality of power terminals and the plurality of ground terminals.

5. The automatic wiring method for a semiconductor integrated circuit according to claim 1, wherein the same information that contains positional information about the plurality of power terminals and the plurality of ground terminals is applied in part of the steps (a), (b), and (c) for macrocell pairs in which arrangement patterns of the plurality of power terminals and the plurality of ground terminals are in a symmetrical relation with each other.

6. The automatic wiring method for a semiconductor integrated circuit according to claim 1, wherein the loop line group contains a chip internal power line, which is located nearest to the outer frame of the macrocell, among chip internal power lines wired at a given interval.

7. The automatic wiring method for a semiconductor integrated circuit according to claim 6, wherein the loop line group is used as a bypass line to connect the chip internal power line with the plurality of power terminals and the plurality of ground terminals.

8. An automatic wiring method for a semiconductor integrated circuit used to form a semiconductor integrated circuit for performing a desired operation by laying out and interconnecting a plurality of macrocells, each implementing a given function, on a semiconductor chip, the method comprising:
   (a) a step of arranging a macrocell, in which a plurality of power terminals and a plurality of ground terminals are formed, on the semiconductor chip;
   (b) a step of forming a loop line group containing a first power line and a first ground line for supplying power to the macrocell along an outer frame of the macrocell; and
   (c) a step of connecting a corresponding one of the plurality of power terminals with the first power line that constitutes the loop line group via a second power line, and connecting a corresponding one of the plurality of ground terminals with the first ground line that constitutes the loop line group via a second ground line; wherein a given area, which is set away from the outer frame of the macrocell arranged on the semiconductor chip in the step (a) towards a center of the macrocell, is defined as a wiring limit area in which at least a part of the loop line group can be arranged.

9. The automatic wiring method for a semiconductor integrated circuit according to claim 8, wherein placement of an internal line layer of the macrocell in the same layer as the first power line and the first ground line that constitute the loop line group is prohibited in the wiring limit area.

10. The automatic wiring method for a semiconductor integrated circuit according to claim 8, wherein a part of an internal line layer of the macrocell is formed in the same layer as the plurality of power terminals and the plurality of ground terminals.

11. The automatic wiring method for a semiconductor integrated circuit according to claim 8, wherein the same information that contains positional information about the plurality of power terminals and the plurality of ground terminals is applied in part of the steps (a), (b), and (c) for macrocell pairs in which arrangement patterns of the plurality of power terminals and the plurality of ground terminals are in a symmetrical relation with each other.

12. The automatic wiring method for a semiconductor integrated circuit according to claim 8, wherein the loop line group contains a chip internal power line, which is located nearest to the outer frame of the macrocell, among chip internal power lines wired at a given interval.

13. The automatic wiring method for a semiconductor integrated circuit according to claim 12, wherein the loop line group is used as a bypass line to connect the chip internal power line with the plurality of power terminals and the plurality of ground terminals.

14. A computer program product, in a computer readable medium, for automatic wiring of a semiconductor integrated circuit used to form a semiconductor integrated circuit for performing a desired operation by laying out and interconnecting a plurality of macrocells, each implementing a given function, on a semiconductor chip, the computer program product comprising:
(a) instruction for arranging a macrocell, in which a plurality of power terminals and a plurality of ground terminals are formed on a line layer, on the semiconductor chip;
(b) instruction for forming a loop line group containing a first power line and a first ground line for supplying power to the macrocell along an outer frame of the macrocell; and
(c) instruction for connecting a corresponding one of the plurality of power terminals with the first power line through a second power line arranged on said line layer, and connecting a corresponding one of the plurality of ground terminals with the first ground line through a second ground line arranged on said line layer.

15. A computer program product, in a computer readable medium, for automatic wiring of a semiconductor integrated circuit used to form a semiconductor integrated circuit for performing a desired operation by laying out and interconnecting a plurality of macrocells, each implementing a given function, on a semiconductor chip, the computer program product comprising:
(a) instruction for arranging a macrocell, in which a plurality of power terminals and a plurality of ground terminals are formed, on the semiconductor chip;
(b) instruction for forming a loop line group containing a first power line and a first ground line for supplying power to the macrocell along an outer frame of the macrocell; and
(c) instruction for connecting a corresponding one of the plurality of power terminals with the first power line that constitutes the loop line group via a second power line, and
connecting a corresponding one of the plurality of ground terminals with the first ground line that constitutes the loop line group via a second ground line; wherein
a given area, which is set away from the outer frame of the macrocell arranged on the semiconductor chip by the instruction (a) towards a center of the macrocell, is defined as a wiring limit area in which at least a part of the loop line group can be arranged.

16. A semiconductor integrated circuit for performing a desired operation in which a plurality of interconnected macrocells, each implementing a given function, is laid out on a semiconductor chip, wherein
a plurality of power terminals and a plurality of ground terminals are formed on a line layer in a macrocell,
a loop line group containing a first power line for supplying power to the macrocell and a first ground line is formed along an outer frame of the macrocell,
a corresponding one of the plurality of power terminals is connected with the first power line through a second power line arranged on said line layer, and a corresponding one of the plurality of ground terminals is connected with the first ground line through a second ground line arranged on said line layer.

17. The semiconductor integrated circuit according to claim 16, wherein the plurality of power terminals and the plurality of ground terminals are arranged in a plurality of rows along an extending direction of the second power line and the second ground line, so as to at least partially overlap with the second power line and the second ground line, and only the same type of terminals in the plurality of power terminals or the plurality of ground terminals are arranged in a straight line along the extending direction.

18. The semiconductor integrated circuit according to claim 16, wherein a part of an internal line layer of the macrocell is formed in the same layer as the plurality of power terminals and the plurality of ground terminals.

19. The semiconductor integrated circuit according to claim 16, wherein the loop line group contains a chip internal power line, which is located nearest to the outer frame of the macrocell, among chip internal power lines wired at a given interval.

20. The semiconductor integrated circuit according to claim 19, wherein the loop line group is used as a bypass line to connect the chip internal power line with the plurality of power terminals and the plurality of ground terminals.

21. A semiconductor integrated circuit for performing a desired operation in which a plurality of interconnected macrocells, each implementing a given function, are laid out on a semiconductor chip, wherein
a plurality of power terminals and a plurality of ground terminals are formed in a macrocell,
a loop line group containing a first power line for supplying power to the macrocell and a first ground line is formed along an outer frame of the macrocell,
a corresponding one of the plurality of power terminals is connected with the first power line that constitutes the loop line group via a second power line, and a corresponding one of the plurality of ground terminals is connected with the first ground line that constitutes the loop line group via a second ground line, and a given area, which is set away front the outer frame of the macrocell towards a center of the macrocell, is defined as a wiring limit area in which at least a part of the loop line group can be arranged.

22. The semiconductor integrated circuit according to claim 21, wherein placement of an internal line layer of the macrocell in the same layer as the first power line and the first ground line that constitute the loop line group is prohibited in the wiring limit area.

23. The semiconductor integrated circuit according to claim 21, wherein a part of an internal line layer of the macrocell is formed in the same layer as the plurality of power terminals and the plurality of ground terminals.

24. The semiconductor integrated circuit according to claim 21, wherein the loop line group contains a chip internal power line, which is located nearest to the outer frame of the macrocell, among chip internal power lines wired at a given interval.

25. The semiconductor integrated circuit according to claim 24, wherein the loop line group is used as a bypass line to connect the chip internal power line with the plurality of power terminals and the plurality of ground terminals.

26. An automatic wiring method for performing a wiring layout using a multilayer line in an electronic computer, comprising:
(a) a step of wiring a first constant potential line for transmitting a constant potential as a power source in an area outside of a macrocell;
(b) a step of acquiring position information for a terminal disposed in the macrocell from a terminal library; and
(c) a step of wiring a second constant potential line for connecting the first constant potential line and the terminal in the same line layer as the terminal based on the acquired position information.

27. The automatic wiring method according to claim 26, wherein the first constant potential line is a ground line.

28. The automatic wiring method according to claim 26, wherein position information for a row of terminals composed of a plurality of terminals lined up in one direction is acquired from the terminal library in the step (b), and the row of terminals and the first constant potential line are connected and the first constant potential line is wired so as to overlap with the row of terminals in the step (c).

29. The automatic wiring method according to claim 28, wherein the positron information for the row of terminals is expressed as position information for one terminal contained in the row of terminals.

30. The automatic wiring method according to claim 26, wherein a plurality of terminals arranged in a matrix to which the constant potential is supplied is formed in the macrocell, and the terminal library comprises position information for each of the plurality of terminals contained in one terminal line of the matrix, and position information for each of the plurality of terminals contained in one terminal row.

31. A semiconductor integrated circuit comprising:
a macrocell;
a first constant potential line formed in an area outside the macrocell for transmitting a constant potential as a power source;
a terminal disposed inside the macrocell and to which the constant potential is supplied; and
a second constant potential line formed in the same line layer as the terminal, for connecting the first constant potential line with the terminal.

32. A computer program product, in a computer readable medium, for automatic wiring to perform a wiring layout using a multilayer line in an electronic computer, comprising:
instruction for wiring a first constant potential line for transmitting a constant potential as a power source in an area outside of a macrocell;
instruction for acquiring position information for a terminal disposed in the macrocell from a terminal library; and
instruction for wiring a second constant potential line for connecting the first constant potential line and the terminal in the same line layer as the terminal based on the acquired position information.

33. An automatic wiring method for performing a wiring layout in an electronic computer, comprising:
a step of acquiring a macrocell from a library and arranging the macrocell;
a step of wiring a loop line group for transmitting a power supply voltage to the macrocell, at least a portion of the loop line group being located in a predefined area of the macrocell:
a step of acquiring position information for a terminal disposed in the macrocell from a library; and
a step of wiring a connection line for connecting the loop line group and the terminal based on the acquired position information.

34. A computer program product, in a computer readable medium, for automatic wiring to perform a wiring layout in an electronic computer, comprising:
instruction for acquiring a macrocell from a library and arranging the macrocell;
instruction for wiring a loop line group for transmitting a power supply voltage to the macrocell, at least a portion of the loop line group being located a predefined area of the macrocell;
instruction for acquiring position information for a terminal disposed in the macrocell from a library; and
instruction for wiring a connection line for connecting the loop line group and the terminal based on the acquired position information.

35. A semiconductor integrated circuit comprising:
a macrocell in which a plurality of terminals is formed;
a loop line group for transmitting power supply voltage to the macrocell, at least a portion of the loop line group being located in a predefined area of the macrocell; and
a connection line for connecting the loop line group and the plurality of terminals.

36. The semiconductor integrated circuit according to claim 35, wherein the connection line and the plurality of terminals are formed in the same line layer.

* * * * *